(12) United States Patent
Totsuka et al.

(10) Patent No.: US 9,350,958 B2
(45) Date of Patent: May 24, 2016

(54) SOLID-STATE IMAGING APPARATUS AND CAMERA

(71) Applicant: CANON KABUSHIKI KAISHA, Tokyo (JP)

(72) Inventors: Hirofumi Totsuka, Fujisawa (JP); Daisuke Yoshida, Ebina (JP); Shinichi Yamashita, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/612,572

(22) Filed: Feb. 3, 2015

(65) Prior Publication Data
US 2015/0237315 A1 Aug. 20, 2015

(30) Foreign Application Priority Data
Feb. 17, 2014 (JP) ................................. 2014-027860

(51) Int. Cl.
| | |
|---|---|
| *H04N 5/369* | (2011.01) |
| *H04N 5/378* | (2011.01) |
| *H04N 9/04* | (2006.01) |
| *H04N 5/357* | (2011.01) |
| *H04N 5/3745* | (2011.01) |
| *H03M 1/00* | (2006.01) |
| *H04N 1/00* | (2006.01) |

(52) U.S. Cl.
CPC ................. *H04N 9/045* (2013.01); *H03M 1/00* (2013.01); *H04N 5/3575* (2013.01); *H04N 5/3696* (2013.01); *H04N 5/378* (2013.01); *H04N 5/3745* (2013.01); *H04N 1/00554* (2013.01)

(58) Field of Classification Search
CPC . H04N 1/00554; H04N 5/3745; H04N 5/378; H04N 9/045; H04N 5/3696; H04N 5/3575; H04N 5/374; H03M 1/00

USPC .............. 348/184, 208.1, 241, 243, 294, 298, 348/302, 572–573
See application file for complete search history.

(56) References Cited

U.S. PATENT DOCUMENTS

| | | | |
|---|---|---|---|
| 7,633,540 B2 | 12/2009 | Totsuka | |
| 7,990,440 B2 | 8/2011 | Kobayashi et al. | |
| 8,084,729 B2 | 12/2011 | Kato et al. | |
| 8,154,639 B2 | 4/2012 | Kato et al. | |
| 8,189,081 B2 | 5/2012 | Totsuka | |
| 8,309,898 B2 | 11/2012 | Kato et al. | |
| 8,400,546 B2 | 3/2013 | Itano et al. | |
| 8,411,185 B2 | 4/2013 | Totsuka | |
| 8,456,554 B2 | 6/2013 | Takahashi | |
| 8,482,447 B2 * | 7/2013 | Hwang | ................ H04N 5/3575 341/155 |

(Continued)

FOREIGN PATENT DOCUMENTS

JP    2010-258817 A    11/2010

*Primary Examiner* — Hung Lam
(74) *Attorney, Agent, or Firm* — Fitzpatrick, Cella, Harper & Scinto

(57) ABSTRACT

A solid-state imaging apparatus, including a plurality of pixels, and an A/D conversion unit configured to convert a pixel signal of an analog signal into a digital signal, wherein the A/D conversion unit comprises a comparator, a sampling unit, a counter, and an output unit configured to output the digital signal based on a count result of the counter and a sampling result of the sampling unit, and the sampling unit comprises first and second latch units configured to latch an output from the comparator in response to first and second clock signals, respectively, and a third latch unit configured to latch an output from the first latch unit in response to an output of the second latch unit.

19 Claims, 19 Drawing Sheets

(56) References Cited

U.S. PATENT DOCUMENTS

| | | |
|---|---|---|
| 8,553,118 B2 | 10/2013 | Saito et al. |
| 8,605,182 B2 | 12/2013 | Totsuka et al. |
| 8,698,062 B2 | 4/2014 | Yoshida |
| 8,773,552 B2 * | 7/2014 | Egawa .................. H04N 5/378 |
| | | 250/208.1 |
| 8,937,672 B2 | 1/2015 | Totsuka et al. |
| 9,013,765 B2 | 4/2015 | Totsuka |
| 2009/0322922 A1 * | 12/2009 | Saito .................... H04N 3/1568 |
| | | 348/308 |
| 2010/0079648 A1 * | 4/2010 | Totsuka ............... H04N 5/3655 |
| | | 348/308 |
| 2011/0074994 A1 * | 3/2011 | Wakabayashi ...... H03M 1/0658 |
| | | 348/302 |
| 2013/0006974 A1 * | 1/2013 | Agrawal ............... G06F 17/301 |
| | | 707/723 |
| 2013/0206961 A1 | 8/2013 | Ikeda et al. |
| 2013/0341489 A1 | 12/2013 | Yoshida |
| 2014/0008522 A1 | 1/2014 | Saito et al. |
| 2014/0168491 A1 | 6/2014 | Totsuka |

\* cited by examiner

FIG. 4A
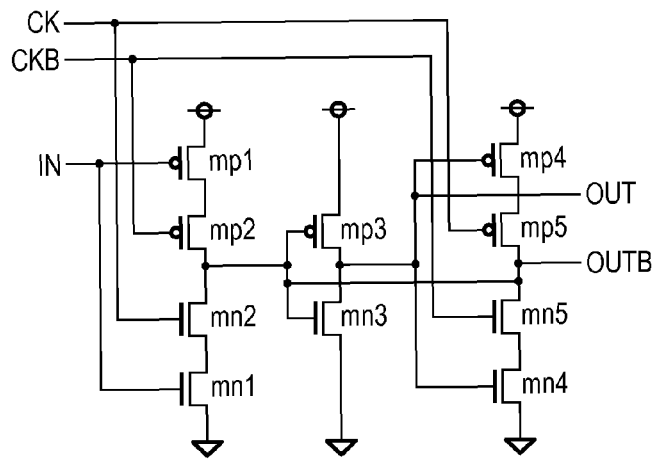
FIG. 4B
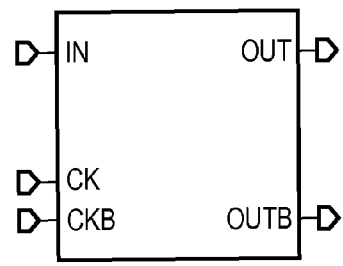
FIG. 4C1
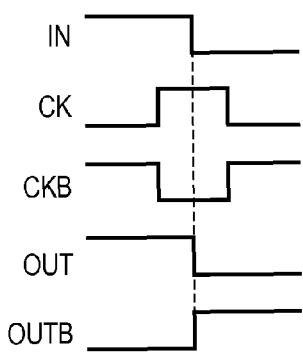
FIG. 4C2
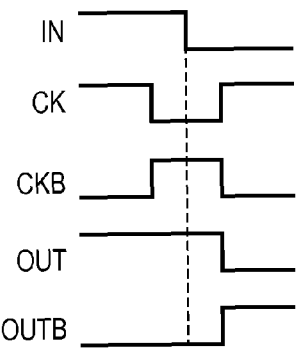
FIG. 4D1
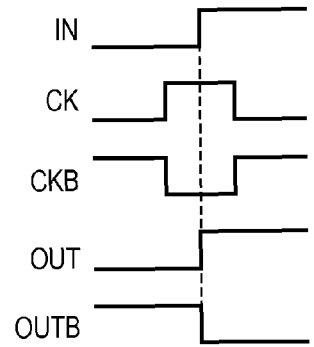
FIG. 4D2
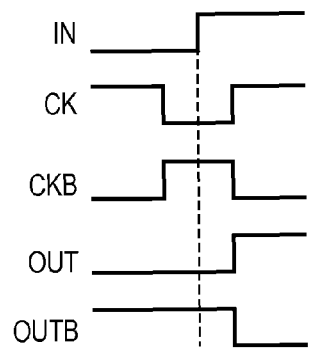
FIG. 4E
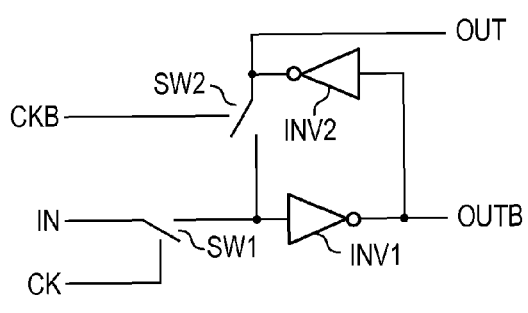

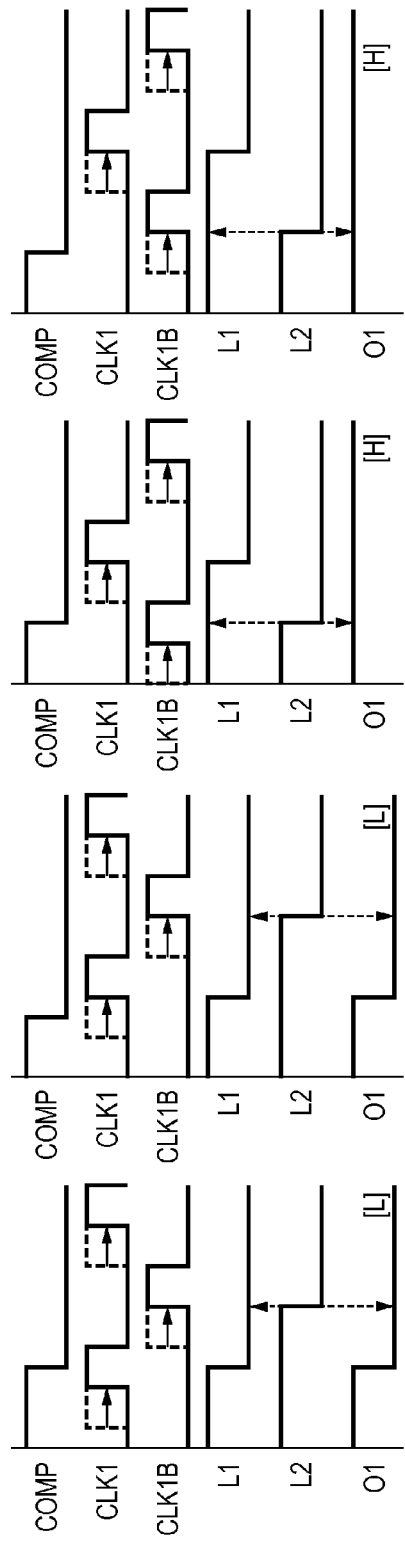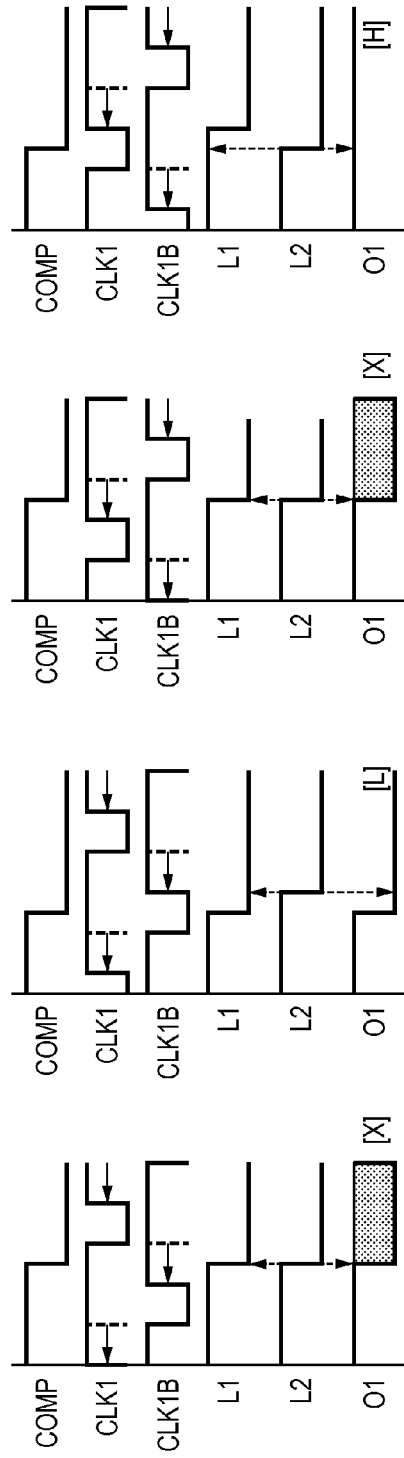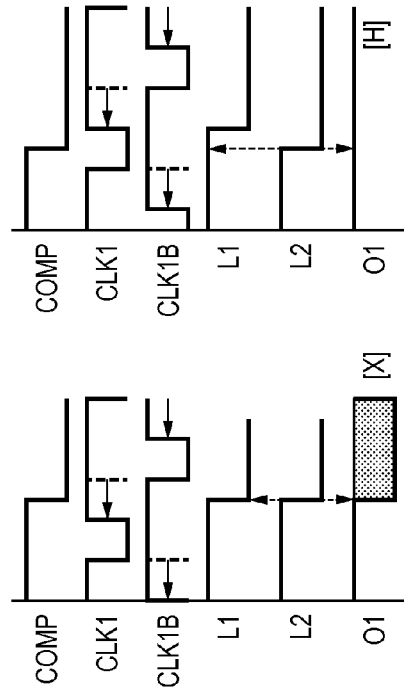

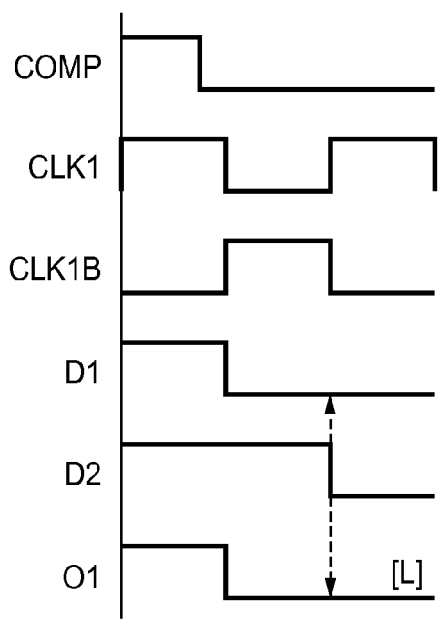 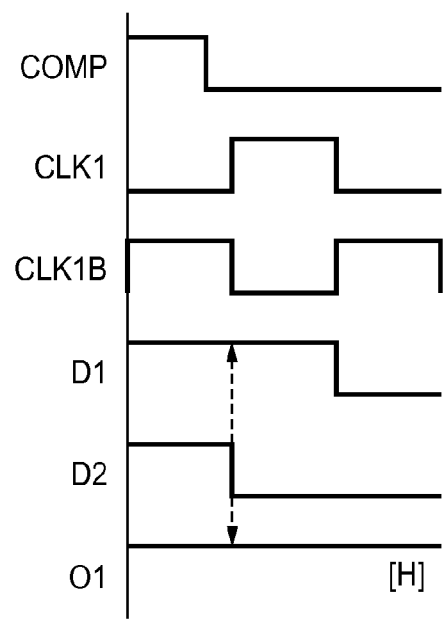

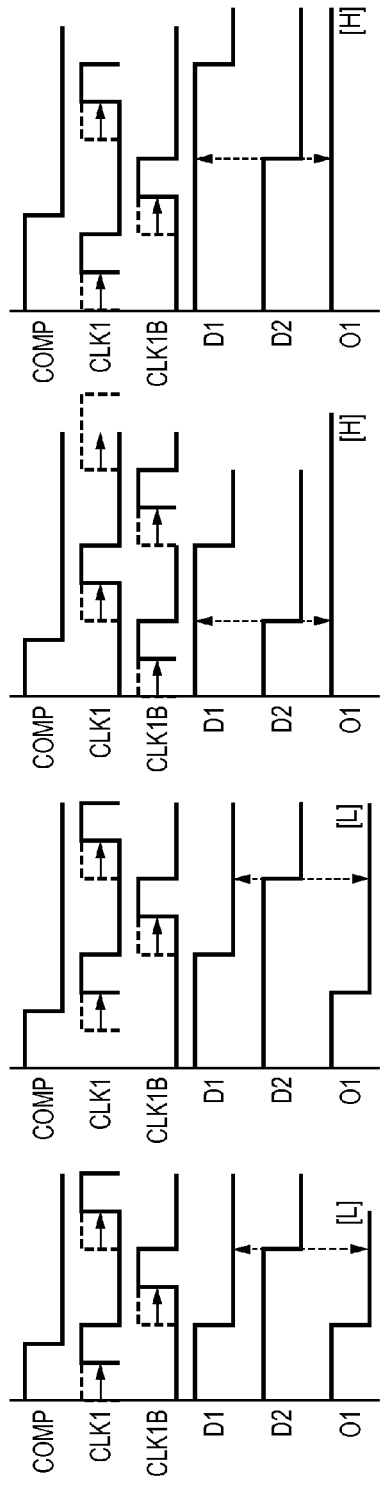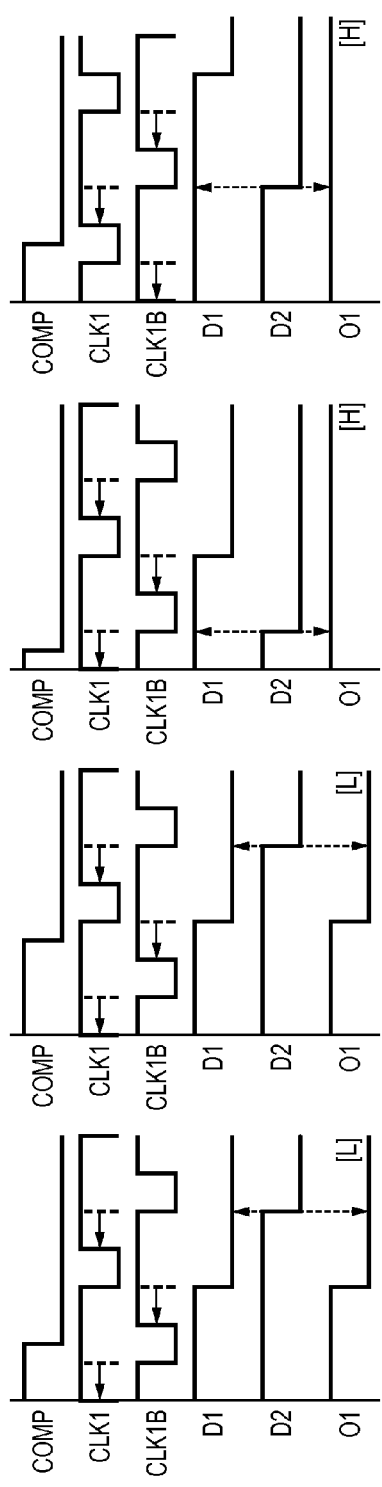

F I G. 15A
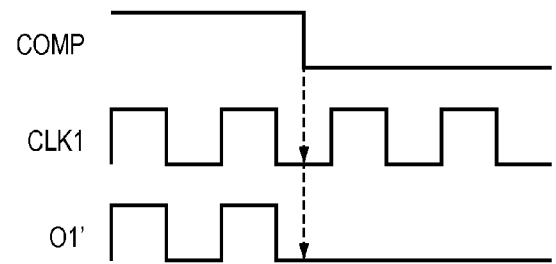
F I G. 15B
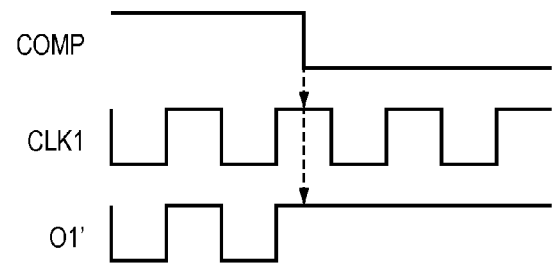
F I G. 15C
| COMP | CLK1 | Ppd | Ppu | O1' |
|------|------|-----|-----|-----|
| H    | -    | L   | L   | CLK1 |
| H    | -    | L   | L   | CLK1 |
| L    | L    | H   | L   | L   |
| L    | H    | L   | H   | H   |

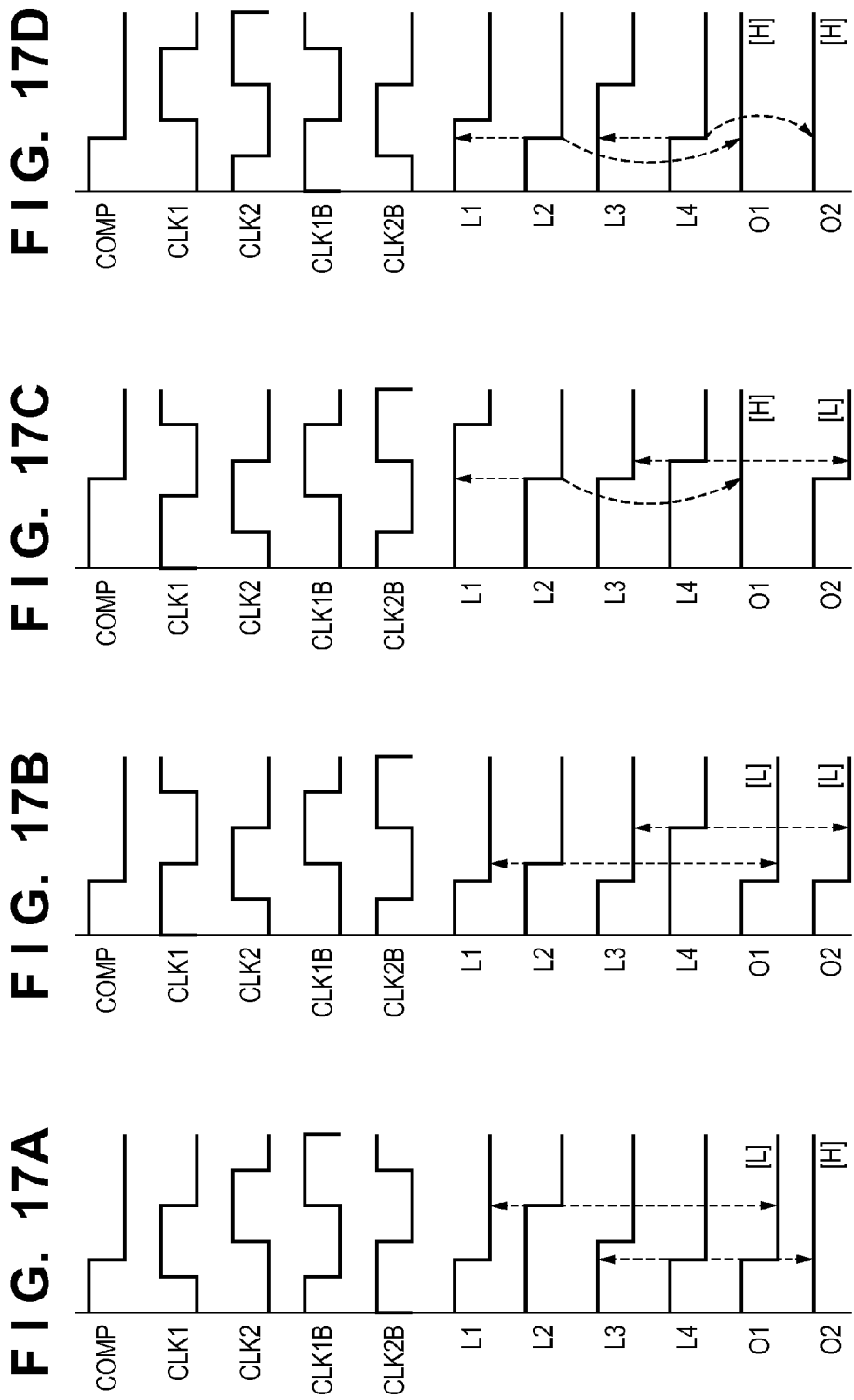

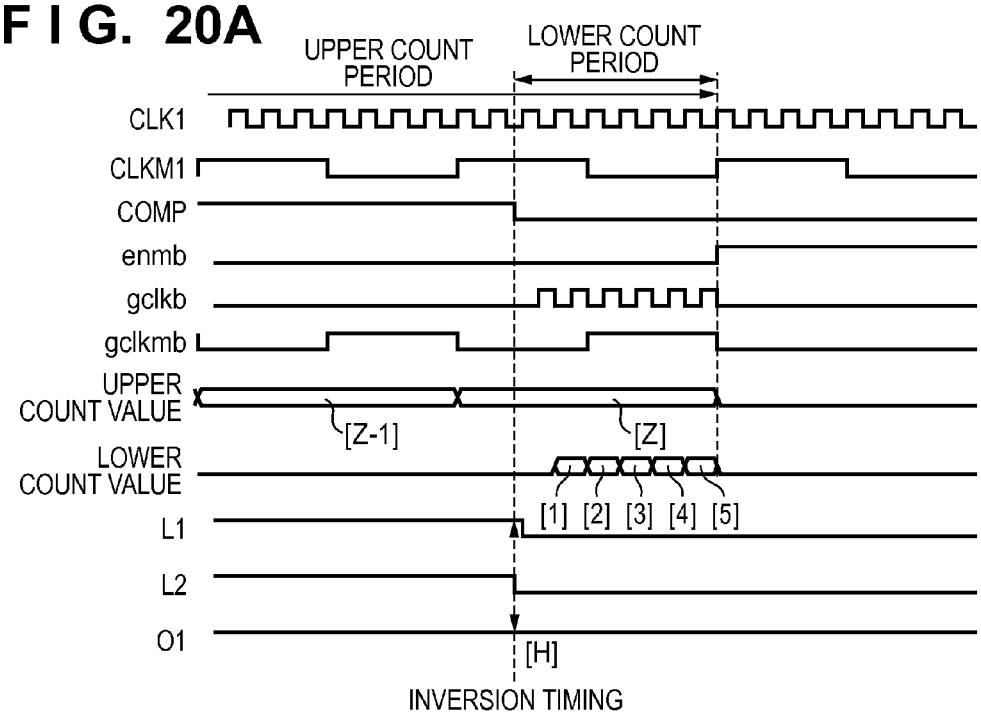
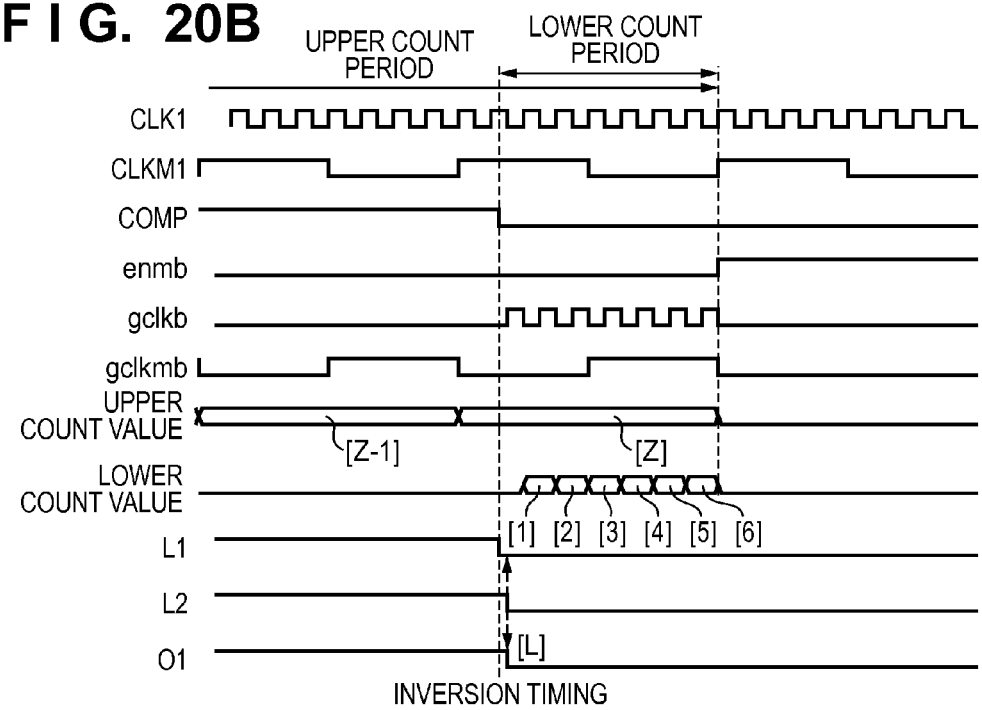

SOLID-STATE IMAGING APPARATUS AND CAMERA

BACKGROUND OF THE INVENTION

1. Field of the Invention

The present invention relates to a solid-state imaging apparatus and a camera.

2. Description of the Related Art

A solid-state imaging apparatus can include a plurality of pixels, and conversion units each of which A/D-converts a signal from each pixel. Each conversion unit includes, for example, a comparison unit which compares the magnitude of a signal from each pixel with that of a ramp signal, and a count unit which counts the time from when comparison starts until the magnitude relationship is reversed. The count unit receives a clock signal, and counts the time using the clock signal. Japanese Patent Laid-Open No. 2010-258817 describes an arrangement in which a conversion unit is provided on each column of a pixel array where a plurality of pixels are arranged in a matrix, and each conversion unit includes a latch unit for holding a count result of a count unit in response to reversal of the magnitude relationship between a signal from each pixel and a ramp signal.

SUMMARY OF THE INVENTION

One of the aspects of the present invention provides a solid-state imaging apparatus including a plurality of pixels, and conversion units each configured to A/D-convert a signal from each of the plurality of pixels, each of the conversion units comprising a comparison unit configured to receive a reference signal, and compare an analog signal from the pixel with the reference signal, a sampling unit configured to receive a first clock signal, and sample a signal level of the first clock signal based on an output of the comparison unit, a counter configured to receive the first clock signal, and count, based on the output of the comparison unit, a time until a magnitude relationship between the analog signal and the reference signal is reversed, and an output unit configured to output a digital signal corresponding to the analog signal based on a count result of the counter and a sampling result of the sampling unit, and the sampling unit comprising a first latch unit configured to latch the output of the comparison unit in response to the first clock signal, a second latch unit configured to latch the output of the comparison unit in response to a second clock signal having a phase different from that of the first clock signal, and a third latch unit configured to latch an output of the first latch unit in response to an output of the second latch unit.

Further features of the present invention will become apparent from the following description of exemplary embodiments (with reference to the attached drawings).

BRIEF DESCRIPTION OF THE DRAWINGS

FIGS. 4A, 4B, 4C1, 4C2, 4D1, 4D2, and 4E are views for explaining an example of the arrangement of a latch unit and an operation in the arrangement;

FIGS. 7A1 to 7A4 and 7B1 to 7B4 are timing charts each for explaining an example of the operation of the clock latch unit;

FIGS. 12A and 12B are timing charts each for explaining the operation of the clock latch unit;

FIGS. 13A1 to 13A4 and 13B1 to 13B4 are timing charts each for explaining an example of the operation of the clock latch unit;

FIGS. 15A to 15C are views for explaining examples of the operation of the unit;

FIGS. 17A to 17D are timing charts each for explaining an example of the operation of the clock latch unit;

FIGS. 20A and 20B are timing charts each for explaining an example of the operation of the readout unit and the clock latch unit;

DESCRIPTION OF THE EMBODIMENTS

Figure 8A:
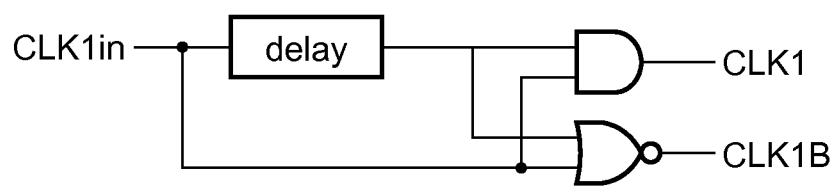
FIGS. 8A and 8B are views for explaining clock signals supplied to the clock latch unit.

A latch circuit described in FIG. 8 of Japanese Patent Laid-Open No. 2010-258817 and the like has an arrangement for latching an input clock signal in response to an output of a comparison unit. Therefore, every time the signal level of the clock signal changes, a through current is unwantedly generated in an inverter or the like constituting the latch circuit.

The through current causes an increase in power consumption. This can be a more serious problem as the number of count units increases by, for example, providing a count unit on each column of a pixel array.

Each embodiment to be described below provides a technique advantageous in reducing the power consumption in A/D conversion of a solid-state imaging apparatus.

(First Embodiment)

Figure 1:
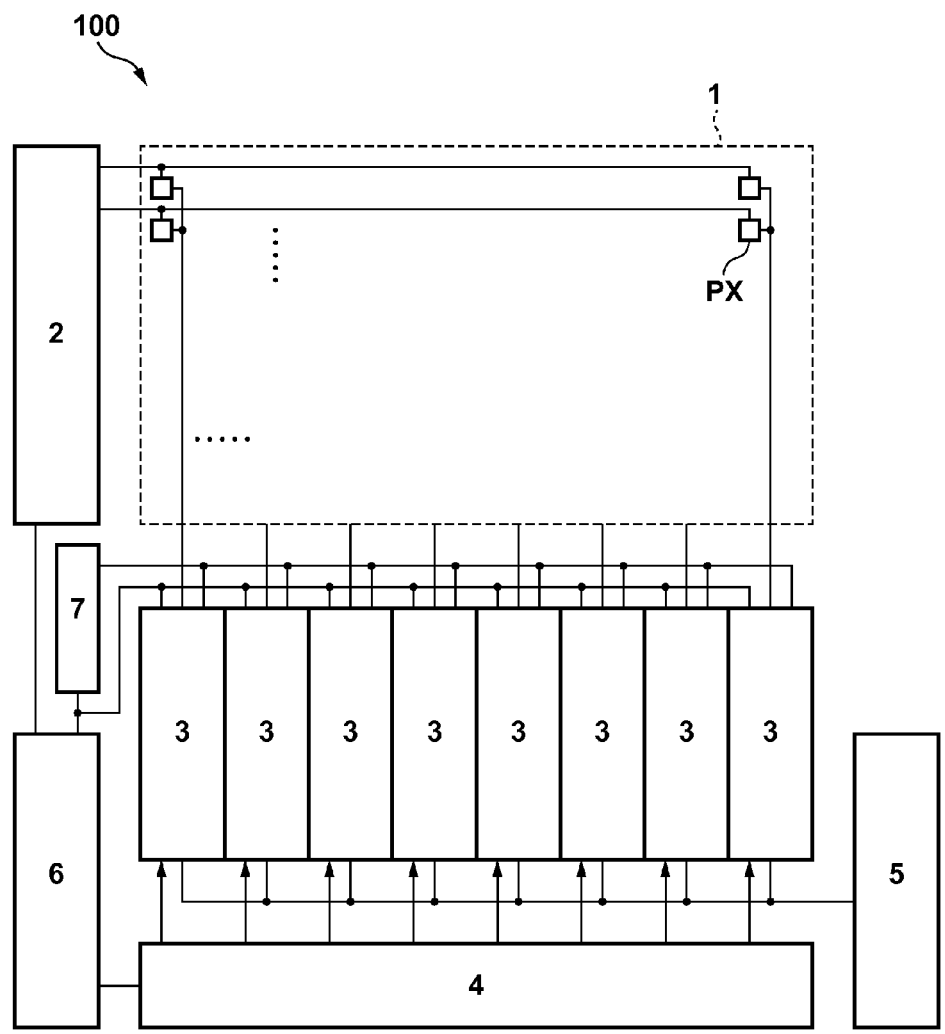
FIG. 1 is a block diagram for explaining an example of the arrangement of a solid-state imaging apparatus.

The first embodiment will be described with reference to FIGS. 1, 2, 3A, 3B, 4A, 4B, 4C1, 4C2, 4D1, 4D2, 4E, 5A, 5B, 6, 7A1 to 7A4, 7B1 to 7B4, 8A, 8B, and 9A to 9C. FIG. 1 is a block diagram showing an example of the arrangement of a solid-state imaging apparatus 100 according to this embodiment. The solid-state imaging apparatus 100 includes a pixel array 1, a vertical scanning circuit 2, readout units 3, a horizontal scanning circuit 4, and a processing unit 5. The pixel array 1 includes a plurality of pixels PX arranged in an array. The vertical scanning circuit 2 outputs, to the pixel array 1, a control signal for reading out a signal from each pixel PX, and sequentially drives the pixels PX for each row. Each readout unit 3 is arranged in correspondence with each column of the pixel array 1, and functions as a conversion unit which performs A/D conversion (analog/digital conversion) for a signal from each pixel PX. The horizontal scanning circuit 4 outputs a control signal to the readout units 3, and horizontally transfers signals from the readout units 3 to be sequentially output. The processing unit 5 performs predetermined processing for the signals read out from the readout unit 3 by horizontal transfer by the horizontal scanning circuit 4. The solid-state imaging apparatus 100 also includes a timing generator 6 which supplies a clock signal to the vertical scanning circuit 2 and the horizontal scanning circuit 4, and a signal generation unit 7 which supplies a reference signal to each readout unit 3. For example, a ramp signal is used as the reference signal.

Figure 2:
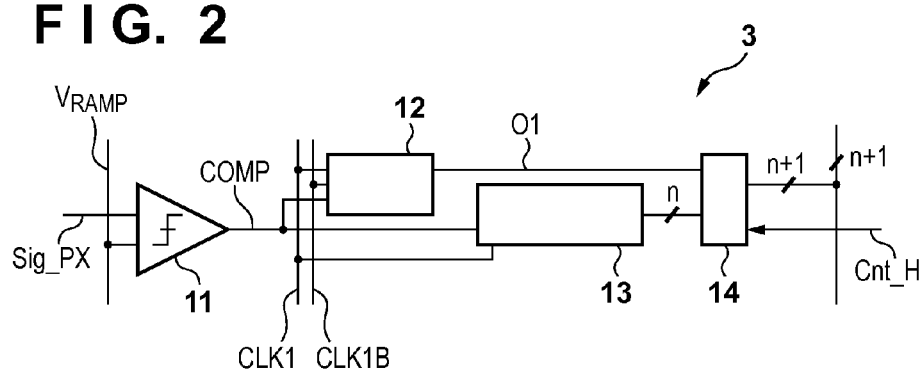
FIG. 2 is a view for explaining an example of the arrangement of a readout unit.

FIG. 2 shows an example of the readout unit 3. The readout unit 3 includes a comparison unit 11, a clock latch unit 12, a counter 13, and an output unit 14. The comparison unit 11 compares a signal (analog signal) from the pixel PX with the reference signal, and outputs a comparison result (output COMP) to the clock latch unit 12 and the counter 13. More specifically, the comparison unit 11 compares the magnitude of a signal Sig_PX from the pixel PX with that of a reference signal $V_{RAMP}$. If the magnitude relationship is reversed, the logical level of the output COMP changes from high level to low level or from low level to high level. The fact that the logical level of the output COMP changes in this way will be expressed by "the output COMP is inverted".

The clock latch unit 12 receives the output COMP and clock signals CLK1 and CLK1B. When, for example, the output COMP is inverted, the clock latch unit 12 holds the signal level of the clock signal CLK1. That is, the clock latch unit 12 functions as a sampling unit which samples the signal level of the clock signal CLK1 in response to the output of the comparison unit 11.

The counter 13 counts the time until the output COMP is inverted by using the clock signal CLK1, and acquires a count value (for example, n bits) corresponding to the time.

The output unit 14 receives a 1-bit output of the clock latch unit 12 and an n-bit output of the counter 13, and outputs an (n+1)-bit digital signal to the processing unit 5 based on the control signal from the horizontal scanning circuit 4. Note that the readout unit 3 may also include, at the preceding stage of the comparison unit 11, an amplification unit which amplifies the signal from the pixel PX, and inputs the signal to the comparison unit. The numbers of output bits of the clock latch unit 12 and the counter 13 are not limited to the above numbers in this example.

Figure 3A:
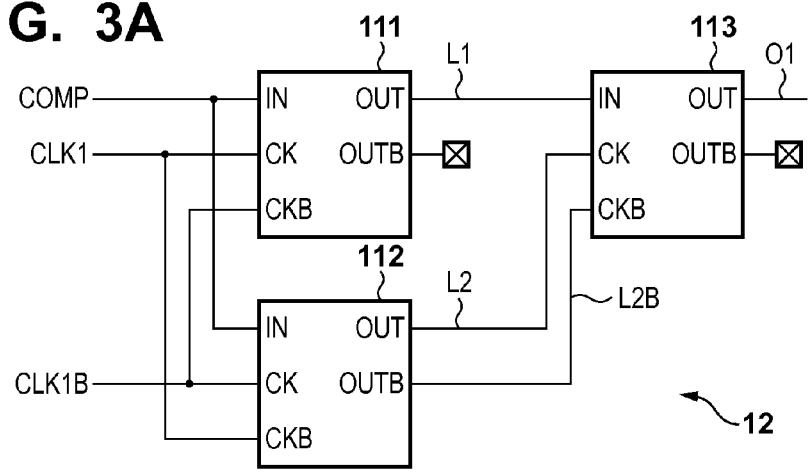
FIGS. 3A and 3B are views each for explaining an example of the arrangement of a clock latch unit.

The clock latch unit 12 will be described with reference to FIGS. 3A and 3B. FIG. 3A shows an example of the arrangement of the clock latch unit 12. The clock latch unit 12 includes a first latch unit 111, a second latch unit 112, and a third latch unit 113. Each of the latch units 111 to 113 includes an input IN as a signal input terminal, inputs CK and CKB as control input terminals, and outputs OUT and OUTB as output terminals. The inputs CK and CKB receive the clock signals CLK1 and CLK1B having different phases. The phase difference between the clock signals is 180°. The output OUTB outputs a signal at a level opposite to that of the output OUT.

In this arrangement, the first latch unit 111 receives the output COMP of the comparison unit at the input IN, and receives the clock signals CLK1 and CLK1B at the inputs CK and CKB. On the other hand, the second latch unit 112 receives the output COMP of the comparison unit at the input IN, and receives the clock signals CLK1B and CLK1 at the inputs CK and CKB. Furthermore, the third latch unit 113 receives an output L1 of the first latch unit 111 at the input IN, and receives an output L2 of the second latch unit 112 and an output L2B as an inverted signal of the output L2 at the inputs CK and CKB. An output O1 of the third latch unit 113 serves as the output of the clock latch unit 12.

In this arrangement, in response to inversion of the output COMP of the comparison unit 11, the first latch unit 111 latches the falling edge of the clock signal CLK1, and the second latch unit 112 latches the falling edge of the clock signal CLK1B. Furthermore, in response to inversion of the output L1 of the first latch unit 111, the third latch unit 113 latches the falling edge of the output L2 of the second latch unit 112. Therefore, in this arrangement, even if the logical levels of the clock signals CLK1 and CLK1B change, no through current is generated in the clock latch unit 12.

FIG. 3A described above shows the arrangement in which each of the first latch unit 111 and the second latch unit 112 receives the two clock signals CLK1 and CLK1B having different phases. This embodiment, however, is not limited to this.

Figure 3B:
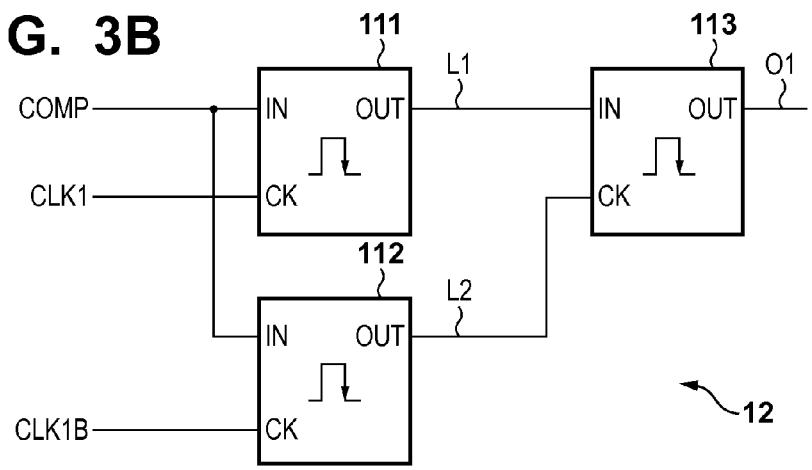

FIG. 3B shows another example of the arrangement of the clock latch unit 12. In this arrangement, the first latch unit 111 receives the clock signal CLK1 and the second latch unit receives the clock signal CLK1B.

More specifically, the first latch unit 111 receives the output COMP of the comparison unit at the input IN, and receives the clock signal CLK1 at the input CK. The second latch unit 112 receives the output COMP of the comparison unit at the input IN, and receives the clock signal CLK1B at the input CK. The clock signal CLK1B is, for example, an inverted signal of the clock signal CLK1. The third latch unit 113 receives the output L1 of the first latch unit 111 at the input IN, and receives the output L2 of the second latch unit 112 at the input CK.

In this arrangement, in response to inversion of the output COMP of the comparison unit 11, the first latch unit 111 latches the falling edge of the clock signal CLK1, and the second latch unit 112 latches the falling edge of the clock signal CLK1B. If the clock signal CLK1B is the inverted signal of the clock signal CLK1, it can be rephrased that the second latch unit 112 latches the rising edge of the clock signal CLK1B. Furthermore, in response to inversion of the output L1 of the first latch unit 111, the third latch unit 113 latches the falling edge of the output L2 of the second latch unit 112. Therefore, in this arrangement as well, even if the logical levels of the clock signals CLK1 and CLK1B change, no through current is generated in the clock latch unit 12. Note that the arrangement in which each latch unit latches the falling edge of a signal has been exemplified. However, each latch may be configured to latch the rising edge of a signal.

FIG. 4A shows an example of the circuit arrangement of the latch unit 111, 112, or 113. FIG. 4B is a symbol diagram showing the latch unit 111, 112, or 113.

FIG. 4C1 is a timing chart when the input IN of the latch unit 111, 112, or 113 changes from high level to low level while the input CK is at high level and the input CKB is at low level. FIG. 4C2 is a timing chart when the input IN changes from high level to low level while the input CK is at low level and the input CKB is at high level. Similarly, FIG. 4D1 is a timing chart when the input IN changes from low level to high level while the input CK is at high level. FIG. 4D2 is a timing chart when the input IN changes from low level to high level while the input CK is at low level.

In the cases shown in FIGS. 4C1 and 4D1, when the signal level of the input IN changes, the output of the output OUT also changes. On the other hand, in the cases shown in FIGS.

4C2 and 4D2, when the input CK changes from low level to high level after the signal level of the input IN changes, the output of the output OUT changes. That is, in the latch unit 111, 112, or 113, when the input CK is at high level, the signal level of the input IN is output from the output OUT intact. While the input CK is at low level, the signal level of the output OUT is maintained.

The circuit arrangement exemplified in FIG. 3A can be formed using the above-described latch units 111 to 113. More specifically, the output COMP of the comparison unit 11 is input to the inputs IN of the latch units 111 and 112. The clock signal CLK1 is input to the input CK of the latch unit 111 and the input CKB of the latch unit 112, and the clock signal CLK1B is input to the input CKB of the latch unit 111 and the input CK of the latch unit 112. The output OUT of the latch unit 111 is input to the input IN of the latch unit 113. The output OUT of the latch unit 112 is input to the input CK of the latch unit 113. The output OUTB of the latch unit 112 is input to the input CKB of the latch unit 113.

A node which connects the output OUT of the latch unit 111 and the input IN of the latch unit 113 is indicated by a "node L1". A node which connects the output OUT of the latch unit 112 and the input CK of the latch unit 113 is indicated by a "node L2". A node which connects the output OUTB of the latch unit 112 and the input CKB of the latch unit 113 is indicated by a "node L2B". Note that both the output OUTB of the latch unit 111 and the output OUTB of the latch unit 113 are in an open state.

Figure 5A:
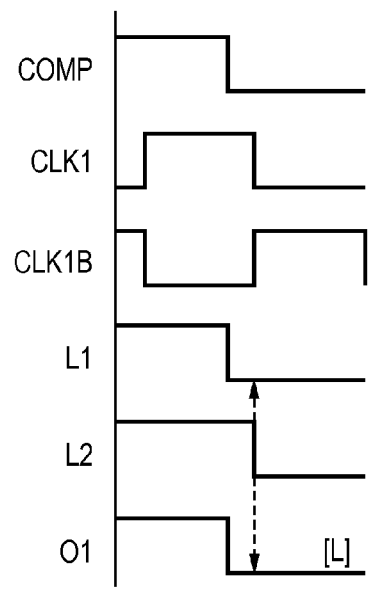
FIGS. 5A and 5B are timing charts each for explaining an example of the operation of the clock latch unit.
Figure 5B:
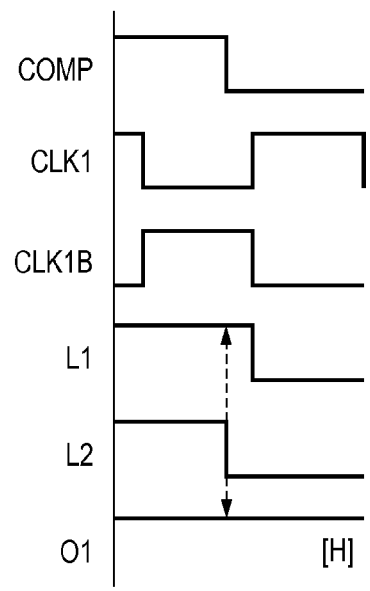

FIGS. 5A and 5B are timing charts each showing the operation of the above-described clock latch unit 12. Each of FIGS. 5A and 5B shows the output COMP of the comparison unit 11, the clock signals CLK1 and CLK1B, the potential levels of the nodes L1 and L2, and the potential level of the output O1 of the clock latch unit 12. The logical levels of the clock signals CLK1 and CLK1B are opposite to each other. FIG. 5A shows a case in which the output COMP changes from high level to low level when the clock signal CLK1 is at high level. FIG. 5B shows a case in which the output COMP changes from high level to low level when the clock signal CLK1 is at low level.

In the case shown in FIG. 5A, when the output COMP changes from high level to low level, the potential level of the node L1 changes from high level to low level. After that, when the clock signal CLK1B changes from high level to low level, the potential level of the node L2 changes from high level to low level. That is, after the potential level of the node L1 changes from high level to low level, the potential level of the node L2 changes from high level to low level (when the potential level of the node L2 is at high level, the potential level of the node L1 changes from high level to low level). Consequently, when the potential level of the node L1 changes from high level to low level, the output O1 of the latch unit 113 changes from high level to low level.

On the other hand, in the case shown in FIG. 5B, when the output COMP changes from high level to low level, the potential level of the node L2 changes from high level to low level. After that, when the clock signal CLK1 changes from low level to high level, the potential level of the node L1 changes from high level to low level. That is, after the potential level of the node L2 changes from high level to low level, the potential level of the node L1 changes from high level to low level (when the potential level of the node L2 is at low level, the potential level of the node L1 changes from high level to low level). Consequently, the output O1 of the third latch unit 113 remains unchanged at high level.

That is, each of the latch units 111 to 113 of the clock latch unit 12 performs a so-called half latch operation of latching the signal level of the input IN at one of the rising edge and falling edge of the clock signal CLK1. In response to the rising edge of the clock signal CLK1, the latch unit 111 latches the output COMP of the comparison unit 11. In response to the falling edge of the clock signal CLK1 (the rising edge of the clock signal CLK1B), the latch unit 112 latches the output COMP. In response to the output of the latch unit 112, the latch unit 113 latches the output of the latch unit 111. As a result, the clock latch unit 12 functions as a sampling unit which samples the signal level of the clock signal CLK1 in response to the output COMP, and acquires the latched signal level as a sampling result.

Figure 6:
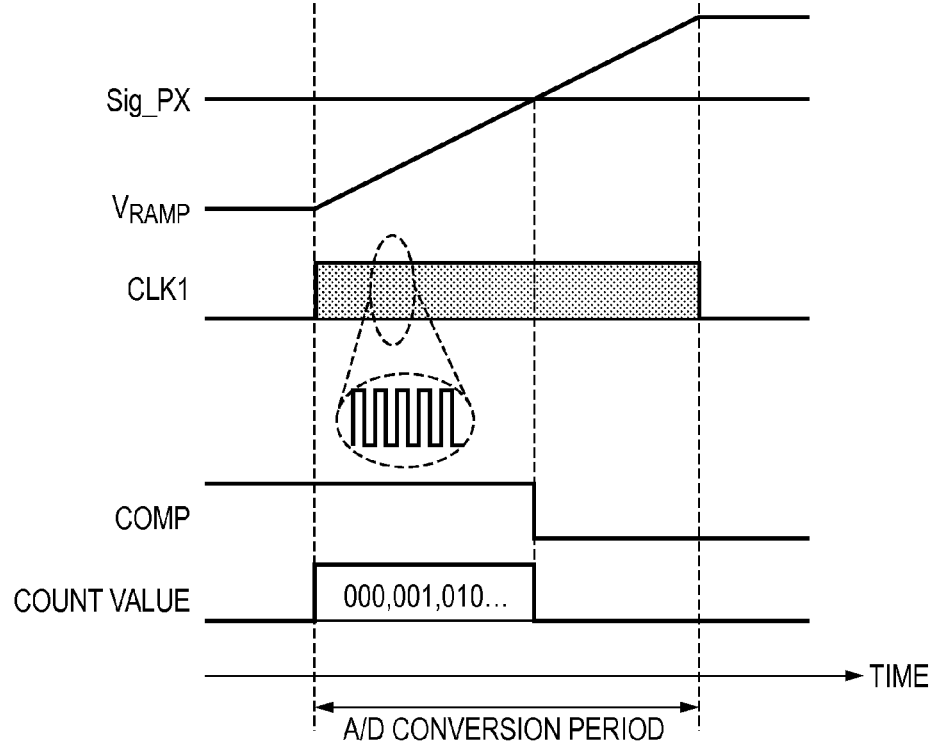
FIG. 6 is a timing chart for explaining an example of the operation of the readout unit.

A count operation by the counter 13 and a count value as a count result will be described with reference to FIG. 6. When counting starts, the potential level of the reference signal $V_{RAMP}$ linearly changes (for example, from low level to high level). Note that an A/D conversion period shown in FIG. 6 is a period during which the potential level of the reference signal $V_{RAMP}$ increases from low level to high level. The comparison unit 11 compares the signal Sig_PX from the pixel PX with the reference signal $V_{RAMP}$. While Sig_PX>$V_{RAMP}$, the output COMP of the comparison unit 11 is at high level. When Sig_PX<$V_{RAMP}$ is satisfied, the logical level of the output COMP is inverted. Note that a ramp waveform which linearly changes has been exemplified as the reference signal $V_{RAMP}$. However, the present invention is not limited to this, and the potential level may change stepwise.

The clock signal CLK1 is supplied to the counter 13. By counting the number of pulses of the clock signal CLK1, the counter 13 counts the time until the magnitude relationship between the signal Sig_PX from the pixel PX and the reference signal $V_{RAMP}$ is reversed. In this way, it is possible to obtain a count value based on the time until the magnitude relationship between the signal Sig_PX from the pixel PX and the reference signal $V_{RAMP}$ is reversed.

As described above, the output unit 14 adds, as a lower bit, the output of the clock latch unit 12 to the count value as the count result of the counter 13, and outputs an (n+1)-bit digital signal to, for example, the processing unit 5. With this arrangement, in addition to the count result of the counter 13, it is possible to obtain a count result at a resolution for half the cycle of the clock signal CLK1. This is advantageous in improving the accuracy of A/D conversion of the signal from the pixel PX.

As exemplified in FIG. 4A, each of the latch units 111 to 113 of the clock latch unit 12 includes a plurality of transistors which are exclusively or selectively driven based on the output COMP of the comparison unit 11, and a plurality of transistors which receive the clock signal CLK1 and the like. More specifically, for example, at the first stage of each of the latch units 111 to 113, NMOS transistors mn1 and mn2 and PMOS transistors mp1 and mp2 are arranged. The gate of each of the transistors mn1 and mp1 is connected to the input IN. The gate of the transistor mn2 is connected to the input CK, and the gate of the transistor mp2 is connected to the input CKB. These four transistors mn1, mn2, mp1, and mp2 are arranged in series so as to form a current path between a power supply node and a ground node (between a power supply and GND).

Therefore, while the output COMP is maintained at high or low level, one of the two transistors mn1 and mp1 which are exclusively driven based on the output COMP of the comparison unit 11 is rendered non-conductive. Thus, while the output COMP is maintained at high or low level, no through current is generated in the path of the four transistors mn1, mn2, mp1, and mp2 arranged in series by receiving the clock signal CLK1 and the like.

From another viewpoint, when the output COMP of the comparison unit 11 is at high level, the transistor mp1 is non-conductive, and thus the gates of transistors mn3 and mp3 forming an inverter circuit of the next stage are not charged. On the other hand, when the output COMP is at low level, the transistor mn1 is non-conductive, and thus the gates of the transistors mn3 and mp3 are not discharged. That is, while the output COMP is maintained at high or low level, charging and discharging by receiving the clock signal CLK1 and the like are not alternately repeated (neither charging nor discharging occurs).

At the succeeding stage, the inverter circuit (transistors mn3 and mp3) and two transistors mn4 and mp4 which receive the output of the inverter circuit are arranged. These two transistors mn4 and mp4 and two transistors mp5 and mn5 which are respectively connected to the inputs CK and CKB are arranged in series so as to form a current path between the power supply and the GND. Since the four transistors mn4, mn5, mp4, and mp5 perform the same operations as those of the transistors mn1, mn2, mp1, and mp2, no through current is generated by receiving the clock signal CLK1 and the like.

In the arrangement shown in FIG. 4A, in the path between the power supply and the GND, when the output COMP is at high level, one of the two transistors arranged in series in the path is non-conductive. When the COMP is at low level, the other transistor is non-conductive. In both cases in which the output COMP is at high level and in which the output COMP is at low level, the path is maintained in an OFF state. Consequently, no through current is generated in the path by receiving the clock signal CLK1 and the like. This embodiment is advantageous in reducing the power consumption in A/D conversion. Note that the arrangement in which the NMOS transistors and PMOS transistors are used has been exemplified. The present invention, however, is not limited to this, and any arrangement in which at least two transistors arranged in series are exclusively driven may be used.

An operation when the duty ratios of the clock signals CLK1 and CLK1B change will be described with reference to FIGS. 7A1 to 7A4 and 7B1 to 7B4. For example, the solid-state imaging apparatus 100 includes two clock signal lines for supplying the clock signals CLK1 and CLK1B to each readout unit 3. The two clock signal lines can be arranged along the row direction of the pixel array 1. A buffer for buffering the clock signal CLK1 and the like is arranged at predetermined intervals on each of the two clock signal lines. The buffer is formed using, for example, an NMOS transistor and a PMOS transistor. However, if the driving forces of the NMOS transistor and the PMOS transistor are different from each other, the duty ratios of the clock signal CLK1 and the like may change.

FIGS. 7A1 to 7A4 and 7B1 to 7B4 are timing charts each showing the signal levels of the nodes L1 and L2 and the output O1 when the duty ratios of the clock signal CLK1 and the like change. In FIGS. 7A1 to 7A4 and 7B1 to 7B4, dotted lines indicate waveforms when the duty ratios of the clock signals CLK1 and CLK1B are 50%.

FIGS. 7A1 to 7A4 show four cases when the duty ratios of the clock signal CLK1 and the like become smaller than 50%. A case in which the duty ratios are 25% will be exemplified. FIG. 7A1 shows a case in which the clock signal CLK1 at the time of inversion of the output COMP (at the time of changing from high level to low level) is at high level. FIGS. 7A2 to 7A4 each show a case in which the clock signal CLK1 at the time of inversion of the output COMP is at low level. FIG. 7A2 shows a case in which the clock signal CLK1 at the time of inversion should be at high level but is actually at low level. FIG. 7A3 shows a case in which the clock signal CLK1B at the time of inversion is at high level. FIG. 7A4 shows a case in which the clock signal CLK1B at the time of inversion should be at high level but is actually at low level.

FIGS. 7B1 to 7B4 show four cases when the duty ratios of the clock signal CLK1 and the like become larger than 50% (for example, 75%), similarly to FIGS. 7A1 to 7A4.

Referring to FIGS. 7A1 to 7A4, when the duty ratios become smaller than 50%, it is possible to appropriately obtain the output O1 in any case. On the other hand, referring to FIGS. 7B1 to 7B4, when the duty ratios become larger than 50%, the potential level of the node L1 and that of the node L2 may be inverted at the same time while both the clock signals CLK1 and CLK1B are at high level in some cases. Consequently, the output O1 may become indefinite. Thus, when the duty ratios become larger than 50%, it may be impossible to appropriately obtain the output O1.

To cope with this, for example, it is only necessary to configure the timing generator 6 to generate in advance the clock signal CLK and the like each having a duty ratio smaller than 50% so as to supply the clock signal CLK1 and the like each having a duty ratio smaller than 50% to each readout unit 3. The timing generator 6 may adopt, for example, a circuit arrangement shown in FIG. 8A. That is, an original clock signal CLK1in is input to one input terminal of an AND circuit and one input terminal of a NOR circuit. Also, the clock signal CLK1in is input to the other input terminal of the AND circuit and the other input terminal of the NOR circuit via a predetermined delay circuit.

Figure 8B:
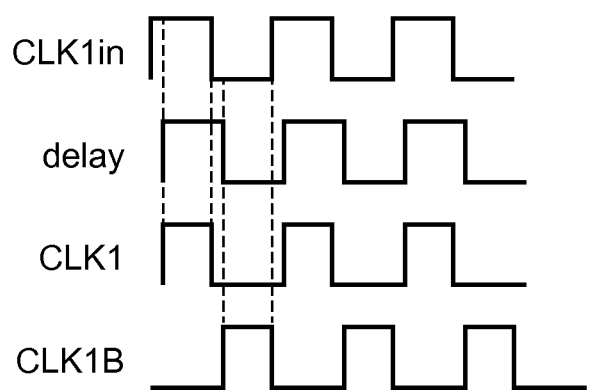

With this arrangement, as shown in FIG. 8B, it is possible to generate the clock signals CLK1 and CLK1B each having a duty ratio smaller than 50%. Furthermore, a buffer formed from an NMOS transistor and PMOS transistor which have different driving forces may be arranged at regular intervals on each of the two clock signal lines for transmitting the clock signal CLK1 and the like, and may be used to buffer the clock signal CLK1 and the like.

According to this embodiment, in both cases in which the output COMP is at high level and in which the output COMP is at low level, the path between the power supply and the GND in the clock latch unit 12 is maintained in the OFF state. Consequently, no through current is generated in the path by receiving the clock signal CLK1 and the like. This embodiment is thus advantageous in reducing the power consumption in A/D conversion.

In this embodiment, the circuit exemplified in FIG. 4A is used as each of the latch units 111 to 113 included in the clock latch unit 12. The arrangement of the clock latch unit 12 is not limited to this. The clock latch unit 12 may adopt any other arrangement in which no through current is generated by receiving the clock signal CLK1 and the like before and after the output COMP is inverted.

Each of the latch units 111 to 113 may adopt, for example, an arrangement exemplified in FIG. 4E in place of the arrangement shown in FIG. 4A. With this arrangement, the latch unit operates by receiving the clock signals having different phases at the inputs CK and CKB. Therefore, while the signal level of a signal supplied to the input IN remains unchanged, the potential of the input node of an inverter INV1 does not change. Consequently, when the signal levels of the inputs CK and CKB change for the first time after the magnitude relationship between the signal from the pixel PX and the reference signal is reversed, a through current is generated in the inverter INV1 and an inverter INV2. It is thus possible to suppress a through current during the A/D conversion period.

Figure 9A:
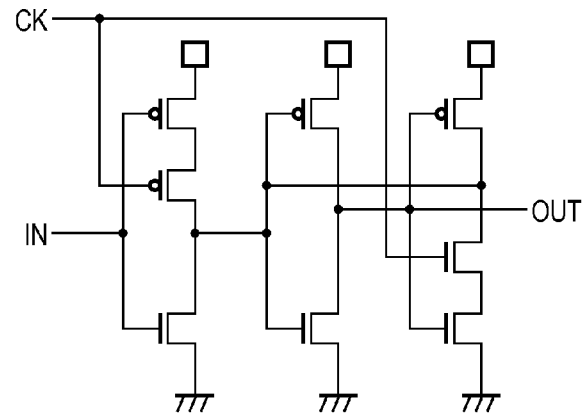
FIGS. 9A to 9C are views for explaining examples of the arrangement of the latch unit.
Figure 9B:
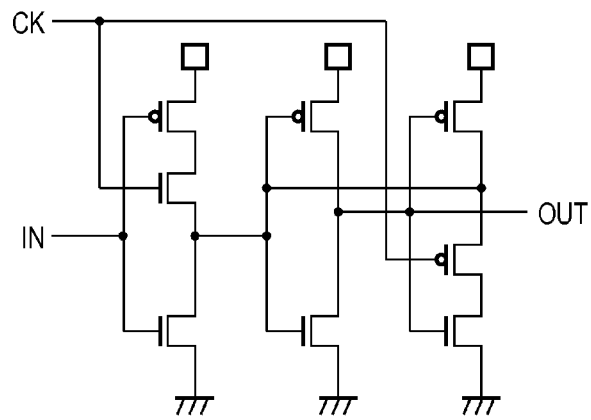
Figure 9C:
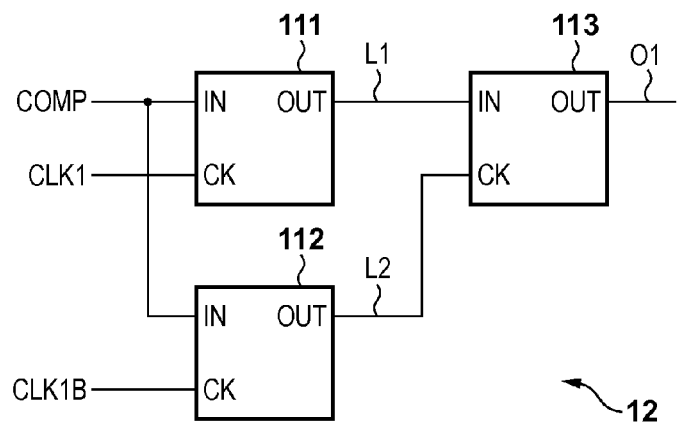

Alternatively, each of the latch units 111 to 113 of the clock latch unit 12 may adopt an arrangement shown in FIG. 9A or an arrangement shown in FIG. 9B. Each of the arrangements includes, among the inputs CK and CKB, the input CK as a control input terminal, and performs a half latch operation by receiving the clock signal CLK1 among the clock signals CLK1 and CLK1B. In the arrangement shown in FIG. 9A, the signal level of the input IN is latched at the rising edge. In the arrangement shown in FIG. 9B, the signal level of the input IN is latched at the falling edge. With these arrangements, the number of transistors may be decreased. In this case, the latch units 111 to 113 need only be connected, as exemplified in FIG. 9C.

In this embodiment, the sampling unit includes three latch units. The first latch unit latches the output of the comparison unit in response to the first clock signal. The second latch unit latches the output of the comparison unit in response to the second clock signal. The third latch unit latches the output of the first latch unit in response to the output of the second latch unit. With this arrangement, it is possible to suppress a through current in the sampling unit while the output of the comparison unit remains unchanged. Note that some practical examples of the arrangement of each latch unit have been exemplified. However, each latch unit may adopt other arrangements.

(Second Embodiment)

Figure 10:
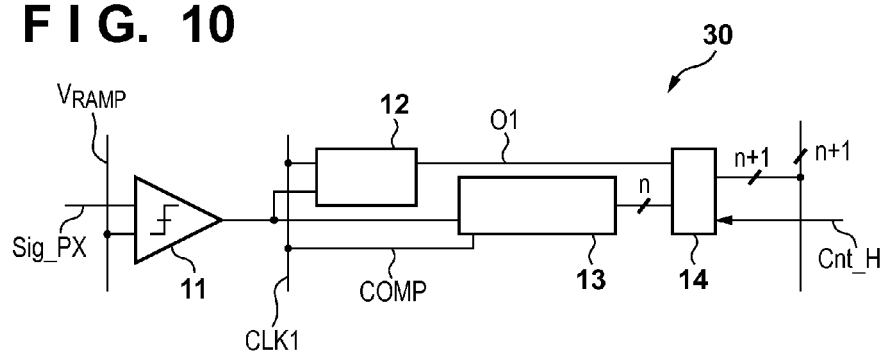
FIG. 10 is a view for explaining an example of the arrangement of a readout unit.

The second embodiment will be described with reference to FIG. 10. A solid-state imaging apparatus 100 may include readout units 30 exemplified in FIG. 10 in place of the readout units 3 exemplified in the first embodiment. Each readout unit 30 of this embodiment is different from the readout unit 3 of the first embodiment in that only a clock signal CLK1 is used in a clock latch unit 12. With this arrangement, it is only necessary to supply, among the clock signal CLK1 and a clock signal CLK1B, the clock signal CLK1 to each readout unit 30. Thus, it is only necessary to provide one clock signal line, and it is possible to decrease the number of buffers for buffering the clock signal. According to this embodiment, it is possible to obtain the same effects as those in the first embodiment, and also decrease the number of clock signal lines and the number of buffers.

In this case, as for latch units 111 to 113 of the clock latch unit 12, for example, the latch unit 111 need only adopt the arrangement shown in FIG. 9A and the latch unit 112 need only adopt the arrangement shown in FIG. 9B. With these arrangements, the latch unit 111 latches the signal level of an input IN at the rising edge of the clock signal CLK1, and the latch unit 112 latches the signal level at the falling edge of the clock signal CLK1.

(Third Embodiment)

Figure 11A:
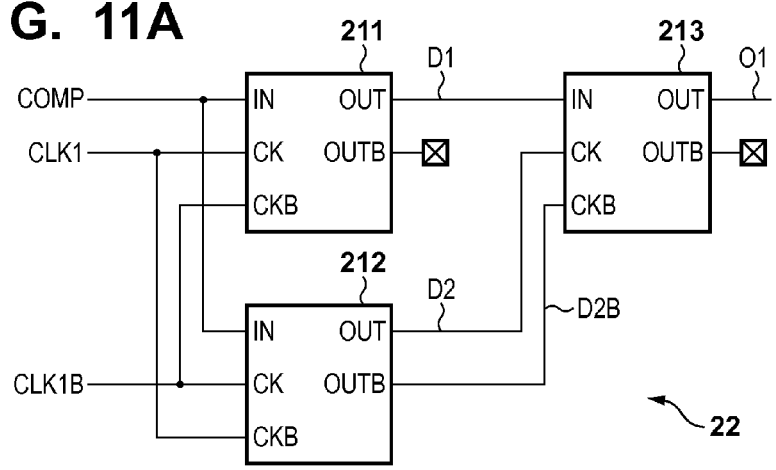
FIGS. 11A and 11B are views for explaining an example of the arrangement of a clock latch unit.

The third embodiment will be described with reference to FIGS. 11A, 11B, 12A, 12B, 13A1 to 13A4, and 13B1 to 13B4. Each readout unit 3 of a solid-state imaging apparatus 100 may include a clock latch unit 22 exemplified in FIGS. 11A and 11B in place of the clock latch unit 12 exemplified in the first embodiment. FIG. 11A shows an example of the arrangement of the clock latch unit 22. The clock latch unit 22 includes a first latch unit 211, a second latch unit 212, a third latch unit 213. Each of the latch units 211 and 212 has a circuit arrangement exemplified in FIG. 11B, and can operate as a master-slave D flip-flop including a master latch unit and a slave latch unit. The latch unit 213 need only be configured to perform the above-described half latch operation by receiving the outputs of the latch units 211 and 212, and the same latch unit as the latch unit 113 in the first embodiment may be used. Note that the nodes L1, L2, and L2B in the first embodiment correspond to nodes D1, D2, and D2B in this embodiment.

FIGS. 12A and 12B are timing charts each showing the operation of the above-described clock latch unit 22, and each showing the potential levels of the nodes D1 and D2, and the potential level of an output O1 of the clock latch unit 22, similarly to FIGS. 5A and 5B.

Referring to FIG. 12A, if an output COMP is inverted to change from high level to low level while a clock signal CLK1 is at high level (that is, a clock signal CLK1B is at low level), when the clock signal CLK1 changes from high level to low level, the potential level of the node D1 changes from high level to low level. Furthermore, after half the cycle of the clock signal elapses, when the clock signal CLK1B changes from high level to low level, the potential level of the node D2 changes from high level to low level. That is, after the potential level of the node D1 changes from high level to low level, the potential level of the node D2 changes from high level to low level. In other words, when the potential level of the node D2 is at high level, the potential level of the node D1 changes from high level to low level. Therefore, when the potential level of the node D1 changes from high level to low level, the output O1 of the latch unit 213 changes from high level to low level.

Referring to FIG. 12B, if the output COMP is inverted to change from high level to low level while the clock signal CLK1 is at low level (that is, the clock signal CLK1B is at high level), when the clock signal CLK1B changes from high level to low level, the potential level of the node D2 changes from high level to low level. Furthermore, after half the cycle of the clock signal elapses, when the clock signal CLK1 changes from high level to low level, the potential level of the node D1 changes from high level to low level. That is, after the potential level of the node D2 changes from high level to low level, the potential level of the node D1 changes from high level to low level. In other words, when the potential level of the node D2 is at low level, the potential level of the node D1 changes from high level to low level. Therefore, the output O1 of the latch unit 213 remains unchanged at high level.

It is possible to obtain the same result as that of the clock latch unit 12 of the first embodiment by using the clock latch unit 22 of this embodiment.

FIGS. 13A1 to 13A4 and 13B1 to 13B4 are timing charts each showing an operation when the duty ratios of the clock signals CLK1 and CLK1B change according to this embodiment, similarly to FIGS. 7A1 to 7A4 and 7B1 to 7B4. According to this embodiment, since the latch units 211 and 212 operate as D flip-flops, the potential level of the node D1 and that of the node D2 are not inverted at the same time. Therefore, since the output O1 never becomes indefinite, it is possible to appropriately obtain the output O1 in both cases in which the duty ratios become smaller than 50% and in which the duty ratios become larger than 50%. That is, the clock latch unit 22 is advantageous in increasing resistance to deterioration in duty ratio.

This embodiment is advantageous in increasing resistance to deterioration in duty ratio while it is possible to obtain the same effects as those in the first embodiment and the like.

(Fourth Embodiment)

Figure 14A:
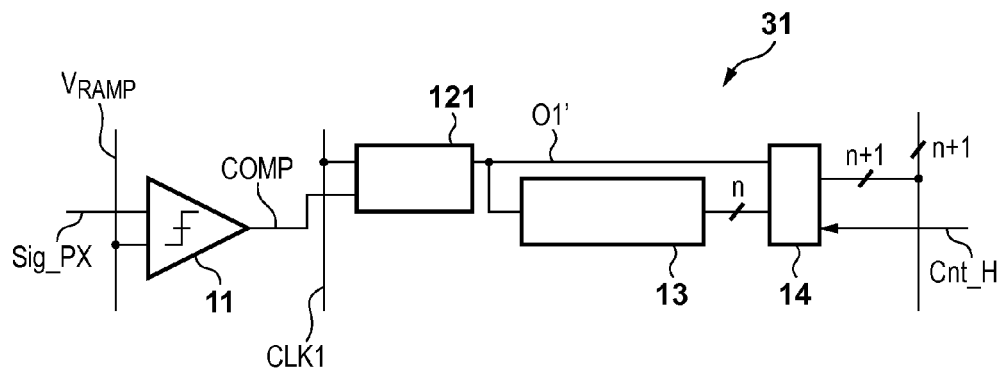
FIGS. 14A and 14B are views for explaining examples of the arrangements of a readout unit and a unit.
Figure 14B:
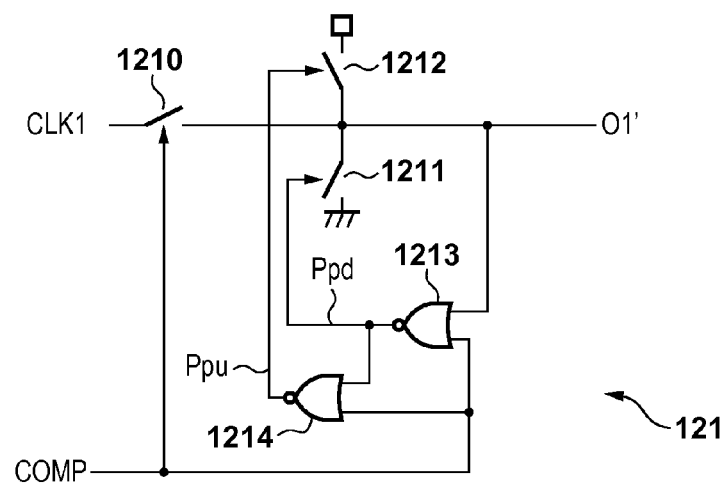

The fourth embodiment will be described with reference to FIGS. 14A, 14B, and 15A to 15C. A solid-state imaging apparatus 100 may include readout units 31 exemplified in FIG. 14 in place of the readout units 3 exemplified in the first embodiment. FIG. 14A shows an example of the arrangement of the readout unit 31, and FIG. 14B shows an example of the arrangement of a unit 121 included in the readout unit 31.

Before an output COMP is inverted to change from high level to low level, the unit 121 outputs a received clock signal CLK1 from an output O1' to a counter 13. On the other hand, after the output COMP is inverted, the unit 121 outputs no received clock signal CLK1. The unit 121 has a function as a control unit which controls supply of the clock signal. Also, the unit 121 has a function as a potential fixing unit which fixes the potential of the clock signal CLK1 (a holding unit which holds a signal level) in response to inversion of the output COMP, in other words, a function as the above-described clock latch unit (sampling unit).

More specifically, the unit 121 includes switches 1210, 1211, and 1212, and NOR circuits 1213 and 1214. The NOR circuit 1213 includes, for example, two input terminals, and receives the clock signal CLK1 at one of the input terminals via the switch 1210 and receives the output COMP of the comparison unit at the other input terminal. The NOR circuit 1214 includes, for example, two input terminals, and receives an output Ppd of the NOR circuit 1213 at one of the input terminals and receives the output COMP of the comparison unit at the other input terminal.

When the output COMP is at high level, the switch 1210 is conductive. When the output COMP is at low level, the switch 1210 is non-conductive. When the output Ppd of the NOR circuit 1213 is at high level, the switch 1211 is conductive. When the output Ppd is at low level, the switch 1211 is non-conductive. When an output Ppu of the NOR circuit 1214 is at high level, the switch 1212 is conductive. When the output Ppu is at low level, the switch 1212 is non-conductive.

FIG. 15A is a timing chart showing the operation of the unit 121 when the output COMP of a comparison unit 11 is inverted to change from high level to low level while the clock signal CLK1 is at low level. FIG. 15B is a timing chart showing the operation of the unit 121 when the output COMP of the comparison unit 11 is inverted while the clock signal CLK1 is at high level. FIG. 15C shows a truth table indicating the states of the output Ppd of the NOR circuit 1213, the output Ppu of the NOR circuit 1214, and the output O1' of the unit 121 when the unit 121 receives the output COMP and the clock signal CLK1.

When the output COMP of the comparison unit 11 is at high level, each of the NOR circuits 1213 and 1214 receives the output COMP at one of the input terminals. In this case, therefore, the outputs Ppd and Ppu of the NOR circuits 1213 and 1214 are at low level and the switches 1211 and 1212 are non-conductive. When the output COMP is at high level, the switch 1210 is conductive, and thus the clock signal CLK1 is output via the output O1'.

When the output COMP of the comparison unit 11 is at low level and the clock signal CLK1 is at low level, the output Ppd of the NOR circuit 1213 which receives the output COMP and the clock signal CLK1 is at high level. Therefore, the switch 1211 is rendered conductive, and the output O1' is set in a pull-down state (low level). Note that the output Ppu of the NOR circuit 1214 is at low level. Since the switch 1210 is rendered non-conductive, the clock signal CLK1 is not output.

When the output COMP of the comparison unit 11 is at low level and the clock signal CLK1 is at high level, the output Ppd of the NOR circuit 1213 which receives the output COMP and the clock signal CLK1 is at low level. On the other hand, the output Ppu of the NOR circuit 1214 which receives the output Ppd and the output COMP is at high level. Therefore, the switch 1212 is rendered conductive, and the output O1' is set in a pull-up state (high level). Note that since the switch 1210 is rendered non-conductive, the clock signal CLK1 is not output.

According to this embodiment, before the output COMP is inverted to change from high level to low level, the switch 1210 is conductive, and the unit 121 outputs the received clock signal CLK1 to the counter 13. At this time, the NOR circuit 1213 receives the clock signal CLK1 at one input terminal, and receives the output COMP at high level at the other input terminal. Thus, one of two series-connected PMOS transistors forming the NOR circuit 1213 is non-conductive. While the output COMP is maintained at high level, therefore, no through current is generated in the NOR circuit 1213 by receiving the clock signal CLK1.

From another viewpoint, the succeeding stage (the switch 1211 or the input gate of the NOR circuit 1214) can be discharged but the succeeding stage is not charged. Consequently, charging and discharging by receiving the clock signal CLK1 are not repeated (neither charging nor discharging occurs).

On the other hand, after the output COMP is inverted, the switch 1210 is rendered non-conductive, and thus no through current is generated in the unit 121 when the unit 121 receives the clock signal CLK1. In this embodiment as well, it is possible to obtain the same effects as those in the first embodiment and the like.

Note that the present invention is not limited to the arrangement exemplified in FIGS. 14A and 14B, and the readout unit 31 and the unit 121 may adopt any arrangements in which it is possible to, based on the output COMP, control supply of the clock signal CLK1 to the counter 13, and sample and hold the signal level of the clock signal CLK1.

For example, the readout unit 31 may include the comparison unit 11, a clock terminal for receiving the clock signal CLK1, the counter 13 including an input terminal, the switch 1210 arranged between the clock terminal and the input terminal, and an output unit 14. The switch operates in response to the output COMP of the comparison unit 11. For example, before the output COMP is inverted, the switch is rendered conductive to supply the clock signal CLK1 to the counter 13 via the input terminal. After the output COMP is inverted, the switch is rendered non-conductive to stop supplying the clock signal CLK1 to the counter 13. With this arrangement, it is possible to control supply of the clock signal CLK1 to the counter 13.

In the arrangement exemplified in FIGS. 14A and 14B, for example, the NOR circuit 1213 receives the output COMP and the clock signal CLK1 as a unit which samples and holds the signal level of the clock signal CLK1. However, the present invention is not limited to this. If, for example, the comparison unit 11 is provided so that the output COMP changes from low level to high level, a NAND circuit may be used in place of the NOR circuit 1213. In this case, the switch 1210 need only be configured to be rendered conductive when the output COMP is at low level, and to be rendered non-conductive when the output COMP is at high level.

(Fifth Embodiment)

Figure 16A:
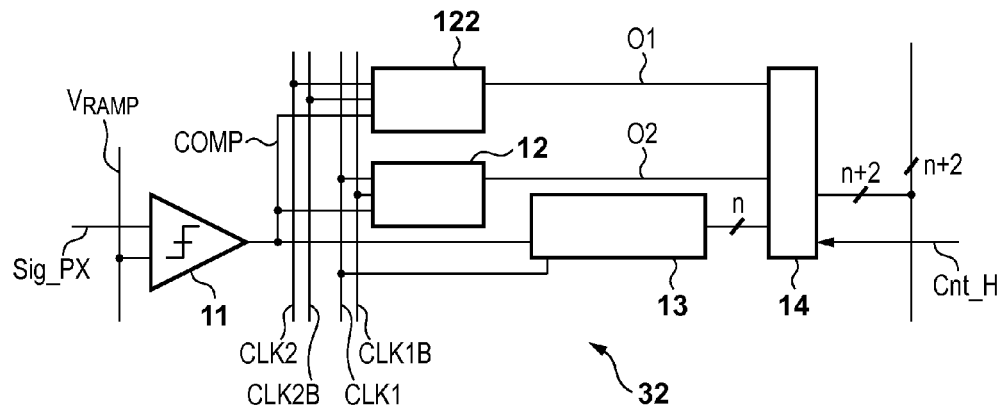
FIGS. 16A and 16B are views for explaining examples of the arrangements of a readout unit and a clock latch unit.
Figure 16B:
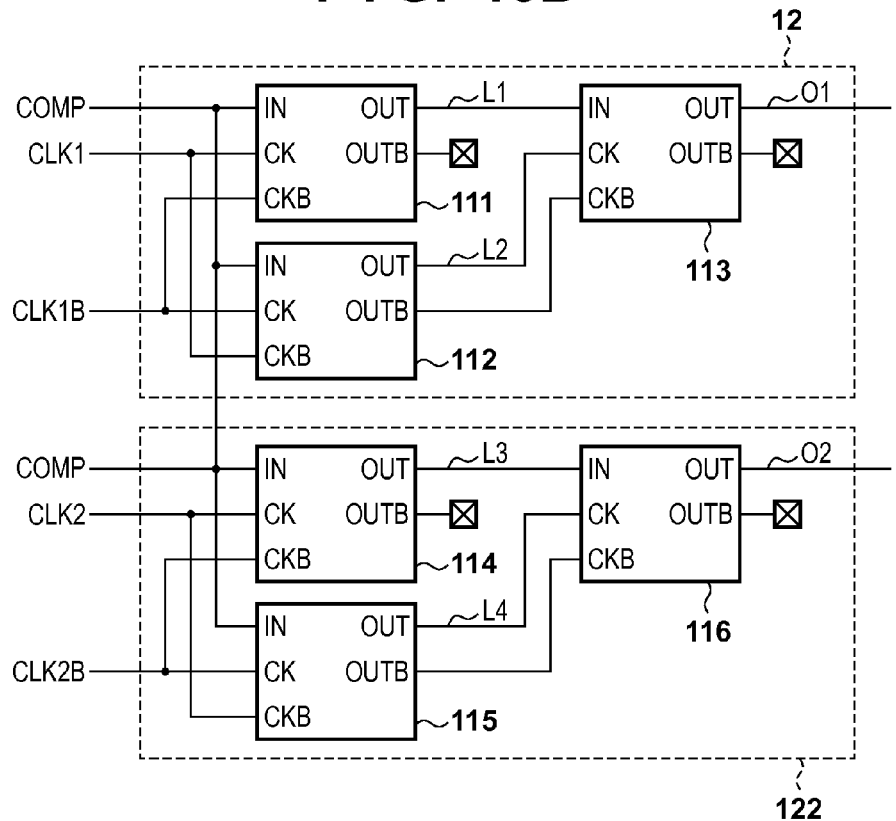
Figure 18:
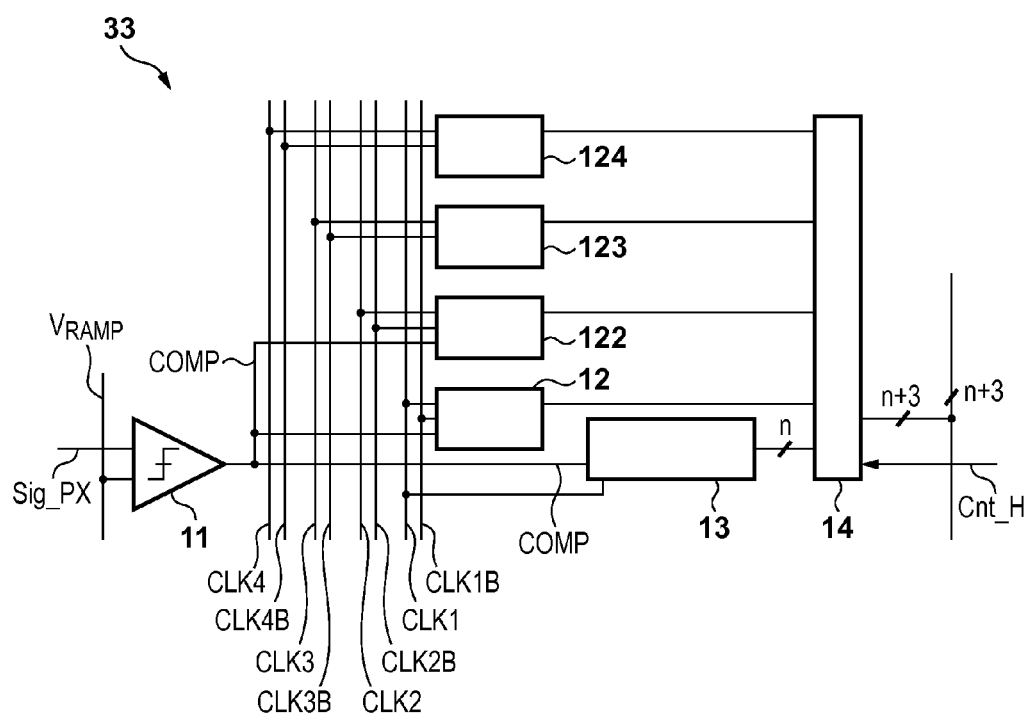
FIG. 18 is a view for explaining an example of the arrangement of a readout unit.

The fifth embodiment will be described with reference to FIGS. 16A, 16B, 17A to 17D, and 18. A solid-state imaging apparatus 100 may include readout units 32 exemplified in FIGS. 16A and 16B in place of the readout units 3 exemplified in the first embodiment. FIG. 16A shows an example of the arrangement of the readout unit 32. FIG. 16B shows an example of the arrangement of clock latch units 12 and 122 included in the readout unit 32. According to this embodiment, the readout unit 32 receives clock signals CLK1 and CLK1B, a clock signal CLK2 having a phase delayed by 90° from that of the clock signal CLK1, and a clock signal CLK2B having a phase opposite to that of the clock signal CLK2. That is, the four clock signals CLK1 and the like in total including the clock signal CLK1, the clock signal CLK2 having a phase difference of 90° with reference to the clock signal CLK1, the clock signal CLK1B having a phase difference of 180°, and the clock signal CLK2B having a phase difference of 270° are supplied to the readout unit 32.

The clock latch unit 122 includes latch units 114, 115, and 116, similarly to the clock latch unit 12. Note that portions in the clock latch unit 122, which correspond to nodes L1 and L2 and an output O1 in the clock latch unit 12, are indicated by nodes L3 and L4 and an output O2.

The clock signals CLK1 and CLK1B are supplied to the clock latch unit 12 of the readout unit 32, and the clock signals CLK2 and CLK2B are supplied to the clock latch unit 122 of the readout unit 32. Each of the clock latch units 12 and 122 performs the same operation as that in the aforementioned first embodiment.

FIGS. 17A to 17D are timing charts showing an output COMP of a comparison unit 11, the clock signals CLK1 and the like, the potential levels of the nodes L1 to L4, and the outputs O1 and O2 in four cases.

FIG. 17A shows a case in which when the clock signal CLK1 is at high level, the clock signal CLK2 is at low level, the clock signal CLK1B is at low level, and the clock signal CLK2B is at high level, the output COMP is inverted to change from high level to low level. FIG. 17B shows a case in which when the clock signal CLK1 is at high level, the clock signal CLK2 is at high level, the clock signal CLK1B is at low level, and the clock signal CLK2B is at low level, the output COMP is inverted. FIG. 17C shows a case in which when the clock signal CLK1 is at low level, the clock signal CLK2 is at high level, the clock signal CLK1B is at high level, and the clock signal CLK2B is at low level, the output COMP is inverted. FIG. 17D shows a case in which when the clock signal CLK1 is at low level, the clock signal CLK2 is at low level, the clock signal CLK1B is at high level, and the clock signal CLK2B is at high level, the output COMP is inverted.

In the case shown in FIG. 17A, the output O1 is at low level and the output O2 is at high level. In the case shown in FIG. 17B, the output O1 is at low level and the output O2 is at low level. In the case shown in FIG. 17C, the output O1 is at high level and the output O2 is at low level. In the case shown in FIG. 17D, the output O1 is at high level and the output O2 is at high level.

An output unit 14 receives a count value as the count result of the counter 13, and the outputs O1 and O2 of the clock latch units 12 and 122. Note that the output unit 14 may include a decoder which decodes the outputs O1 and O2 of the clock latch units 12 and 122 into other binary values. The output unit 14 can add, as lower bits, data (2 bits in this example) based on the outputs O1 and O2 to the count value (n bits in this example) of the counter 13, and output an (n+2)-bit digital signal. Note that the case in which the output unit 14 includes the decoder which decodes the outputs O1 and O2 has been exemplified. However, the decoder may be provided separately from the output unit 14, or further provided in a succeeding unit such as a processing unit 5. That is, the values of the outputs O1 and O2 may be changed into values appropriate for subsequent signal processing, as needed.

This embodiment is advantageous in further improving the accuracy of A/D conversion while it is possible to obtain the same effects as those in the first embodiment and the like.

The arrangement in which the four kinds of clock signals CLK1 and the like are supplied to the readout unit 32 including the two clock latch units 12 and 122 has been exemplified. However, the numbers are not limited to them in the aforementioned embodiment, and may be changed to, for example, increase the number of lower bits added to the count value. More specifically, as exemplified in FIG. 18, an arrangement in which eight kinds of clock signals CLK1 to CLK4 and CLK1B to CLK4B are supplied to a readout unit 33 including four clock latch units 12 and 122 to 124 may be adopted. That is, if N clock latch units are included, it is only necessary to use N kinds of clock signals including the clock signal CLK1 and clock signals each having a phase difference of 360°×k/N with respect to the clock signal CLK1 where N is an integer of 2 or more and k is an integer between 1 and N−1. Note that N is generally the power of 2.

Note that each of the clock latch units 12 and 122 having the same arrangement as that in the aforementioned first embodiment has been exemplified. The arrangement is not limited to this. For example, each of the clock latch units 12 and 122 may be configured to receive the clock signals CLK1 and CLK2 with the arrangement exemplified in the aforementioned second embodiment. As another embodiment, the latch units 111, 112, 114, and 115 of the clock latch units 12 and 122 may operate as master-slave D flip-flops, as exemplified in the aforementioned third embodiment.

(Sixth Embodiment)

Figure 19A:
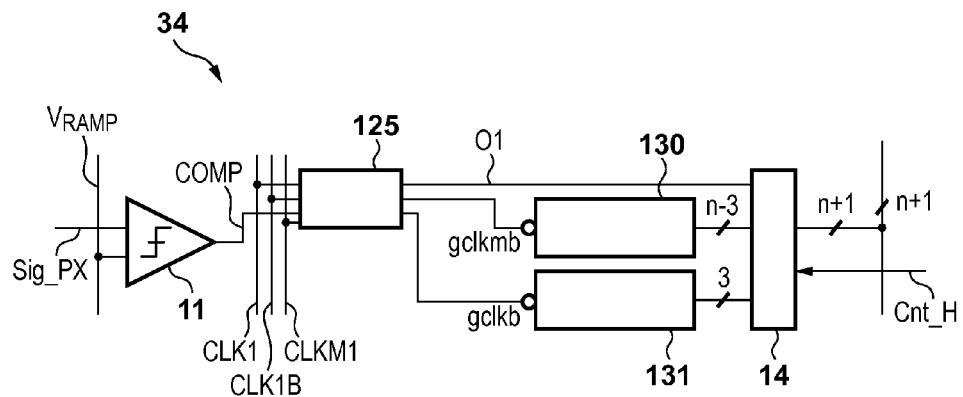
FIGS. 19A and 19B are views for explaining examples of the arrangements of a readout unit and a clock latch unit.
Figure 19B:
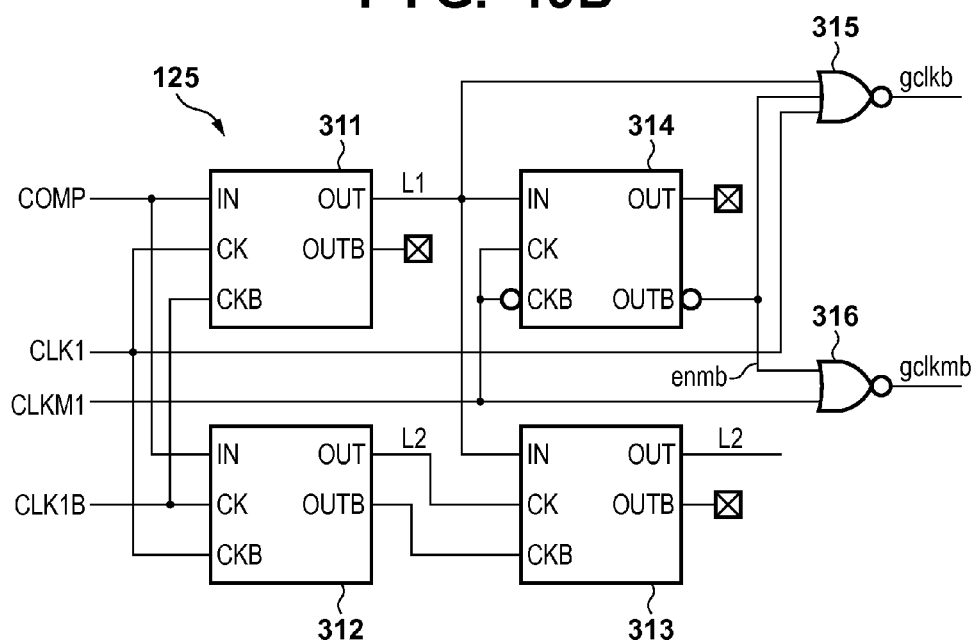

The sixth embodiment will be described with reference to FIGS. 19A, 19B, 20A, and 20B. A solid-state imaging apparatus 100 may include readout units 34 exemplified in FIGS. 19A and 19B in place of the readout units 3 exemplified in the first embodiment. FIG. 19A shows an example of the arrangement of the readout unit 34. FIG. 19B shows an example of the arrangement of a unit 125 included in the readout unit 34. In this embodiment, in addition to clock signals CLK1 and CLK1B, a low-speed clock signal CLKM1 having a frequency which is ⅛ the frequency of the clock signal CLK1 is used.

A first counter 130 included in the readout unit 34 serves as an upper counter which performs counting by receiving an inverted signal (signal gclkmb) of the low-speed clock signal CLKM1 from the unit 125, and acquires, for example, an (n−3)-bit count value. A second counter 131 included in the readout unit 34 serves as a lower counter which performs counting by receiving an inverted signal (signal gclkb) of the clock signal CLK1 from the unit 125, and acquires, for example, a 3-bit count value. The counter 130 will be referred to as the "upper counter 130" hereinafter, and the counter 131 will be referred to as the "lower counter 131" hereinafter.

Figure 11B:
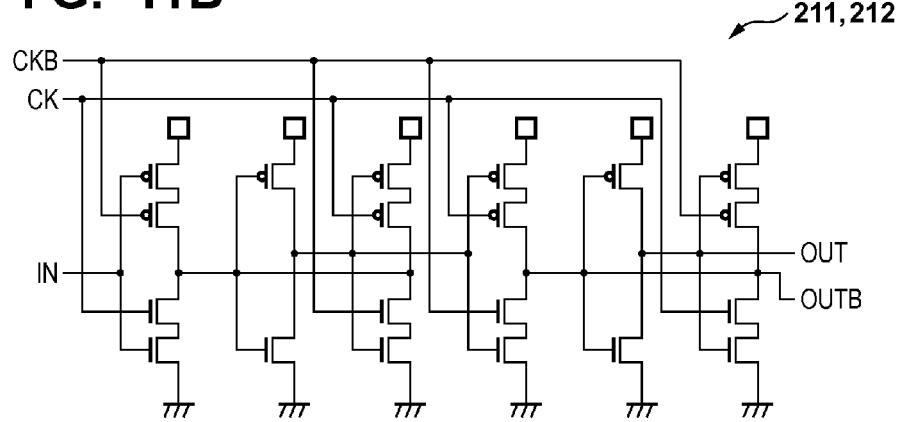

The unit 125 includes latch units 311 to 313 each having the circuit arrangement exemplified in FIG. 4A, a latch unit 314 which operates as a master-slave D flip-flop exemplified in FIG. 11B, and NOR circuits 315 and 316. The latch units 311 to 313 need only be connected as in the first embodiment and their operations are the same as those in the first embodiment, and thus a description thereof will be omitted.

The latch unit 314 need only be arranged to receive a signal from the latch unit 311 at an input IN, receive the low-speed clock signal CLKM1 at an input CK, and receive the low-speed clock signal CLKM1 at an input CKB via an inverter. The NOR circuit 315 receives the signal from the latch unit 311, a signal from the latch unit 314, and the clock single CLK1, and outputs the signal gclkb to the lower counter 131. The NOR circuit 316 receives the signal from the latch unit 314 and the low-speed clock signal CLKM1, and outputs the signal gclkmb to the upper counter 130.

With this arrangement, in addition to sampling of the signal level of the clock signal CLK1, the unit 125 supplies the clock signal CLK1 and the low-speed clock signal CLKM1 to the counters 130 and 131, and stops supplying them. Note that a node connecting the latch unit 314 and the NOR circuits 315 and 316 is indicated by a "node enmb".

FIGS. 20A and 20B are timing charts each showing the operation of the above-described unit 125. FIG. 20A shows a case in which when the clock signal CLK1 is at low level, an output COMP of a comparison unit 11 is inverted (changes from high level to low level). FIG. 20B shows a case in which when the clock signal CLK1 is at high level, the output COMP of the comparison unit 11 is inverted.

The signal gclkb will first be described. Before the output COMP is inverted, the potential level of a node L1 is at high level, the potential level of the node enmb is at low level, and thus the signal gclkb is at low level. After the output COMP is inverted (FIG. 20A) or in response to the inversion (FIG. 20B), the potential level of the node L1 changes from high level to low level. After that, during a period in which the low-speed clock signal CLKM1 changes from low level to high level, the signal gclkb is an inverted signal of the clock signal CLK1. After that, the potential level of the node enmb is set at high level, and thus the signal gclkb is set at low level. Note that a period from when the output COMP of the comparison unit 11 is inverted until the low-speed clock signal CLKM1 changes from low level to high level is indicated by a "lower count period".

The signal gclkmb will be described next. During a period from when the comparison unit 11 starts comparison until the low-speed clock signal CLKM1 changes from low level to high level, that is, until the potential level of the node enmb changes from low level to high level, after the output COMP of the comparison unit 11 is inverted, the signal gclkmb is an inverted signal of the low-speed clock signal CLKM1. After that, since the potential level of the node enmb is set at high level, the signal gclkmb is set at low level. Note that a period from when the comparison unit 11 starts comparison until the low-speed clock signal CLKM1 changes from low level to high level after the output COMP of the comparison unit 11 is inverted is indicated by an "upper count period".

As described above, the upper counter 130 performs counting by receiving the signal gclkmb, and the lower counter 131 performs counting by receiving the signal gclkb. Consequently, the upper counter 130 performs counting during the upper count period, and the count value of the upper counter 130 is added in accordance with the signal gclkmb. On the other hand, the lower counter 131 performs counting during the lower count period, and the count value of the lower counter 131 is added in accordance with the signal gclkb.

An output unit 14 calculates a count value CNT corresponding to the time from when the comparison unit 11 starts comparison until the output COMP of the comparison unit is inverted by using, for example, the count value of the upper counter 130 and the count value of the lower counter 131. For example, in the case shown in FIG. 20B, the upper counter 130 performs counting Z times in a cycle of the low-speed clock signal CLKM1, and the lower counter 131 performs counting six times in a cycle of the clock signal CLK1. The cycle of the low-speed clock signal CLKM1 is eight times the cycle of the clock signal CLK1. In this case, the count value CNT=(the count value "Z" of the upper counter 130)×8−(the count value "6" of the lower counter 131). After that, the output unit 14 can add data (1 bit in this example) based on an output O1 to the count value CNT (n bits in this example) as a lower bit, and output an (n+1)-bit digital signal.

According to this embodiment, it is possible to obtain the following effects in addition to the same effects as those in the first embodiment and the like. That is, since the lower counter 131 receives the signal gclkb only for a period of eight cycles of the clock signal CLK1, it is possible to suppress the above-described through current. Furthermore, since the upper counter 130 only receives the signal gclkmb having a frequency which is ⅛ the frequency of the clock signal CLK1, it is possible to suppress the above-described through current. This embodiment is advantageous in reducing the power consumption in the counters 130 and 131 while it is possible to obtain the same effects as those in the first embodiment and the like.

(Seventh Embodiment)

In each of the above-described embodiments, an arrangement in which a counter is provided on each column of a pixel array has been exemplified. The present invention is applicable to an arrangement in which a common counter is provided in correspondence with conversion units on a plurality of columns.

Figure 21:
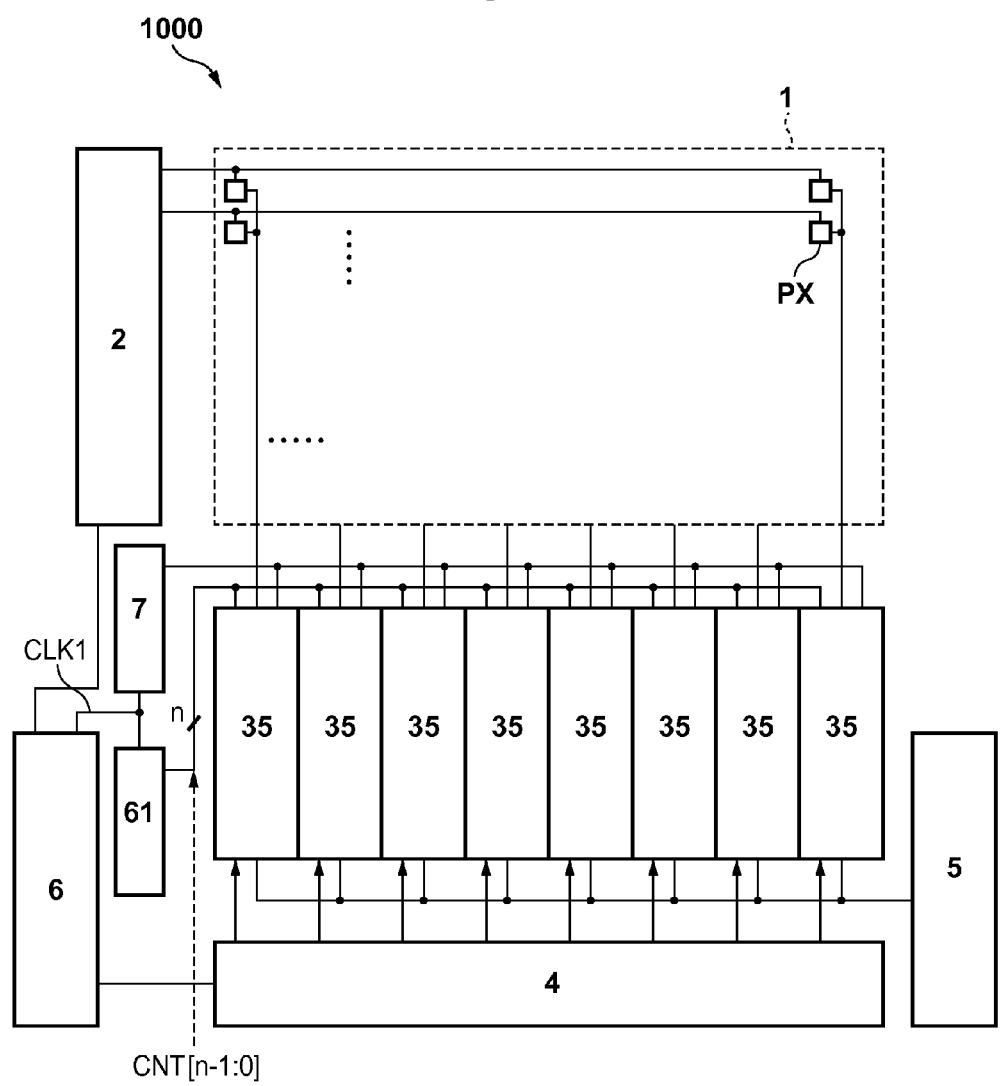
FIG. 21 is a block diagram for explaining an example of the arrangement of a solid-state imaging apparatus.

The seventh embodiment will be described with reference to FIGS. 21, 22A, and 22B. FIG. 21 is a block diagram showing an example of the arrangement of a solid-state imaging apparatus 1000 according to this embodiment. The solid-state imaging apparatus 1000 further includes a counter 61. The counter 61 receives a clock signal CLK1 from a timing generator 6, and outputs an n-bit count value CNT[n−1:0] to a readout unit 35 on each column.

Figure 22A:
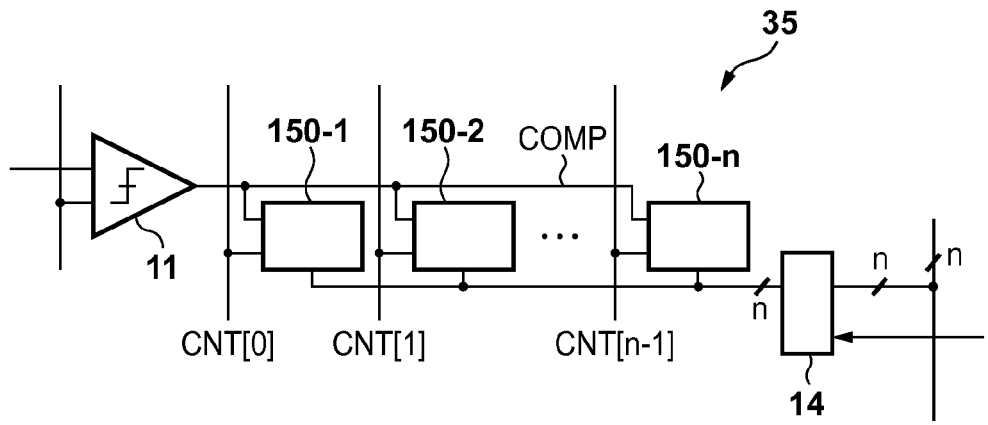
FIGS. 22A and 22B are views for explaining an example of the arrangement of a readout unit and an operation in the arrangement, respectively.

FIG. 22A shows an example of the arrangement of the readout unit 35. FIG. 22B is a timing chart showing the operation of the readout unit 35. The readout unit 35 includes a comparison unit 11, n clock latch units 150 (150-1 to 150-n), and an output unit 14. Each of the clock latch units 150 (150-1 to 150-n) receives a corresponding count value CNT[n−1:0] as a clock signal, and performs counting. The operation of each clock latch unit 150 is the same as that of the clock latch unit 12 of the aforementioned first embodiment. That is, in response to inversion of an output COMP of the comparison unit 11 to change from high level to low level, each of the clock latch units 150 (150-1 to 150-n) samples the value of the corresponding count value CNT[n−1:0].

Note that the arrangement in which one count value CNT[n−1:0] is input to each clock latch unit 150 has been explained for the sake of simplicity. If the arrangement of the clock latch unit 12 of the aforementioned first embodiment is adopted, an inverted signal of the count value can also be input. Alternatively, each clock latch unit 150 may have an arrangement in which the above-described half latch operation is performed using only one clock signal, as exemplified in FIGS. 9A to 9C.

Figure 22B:
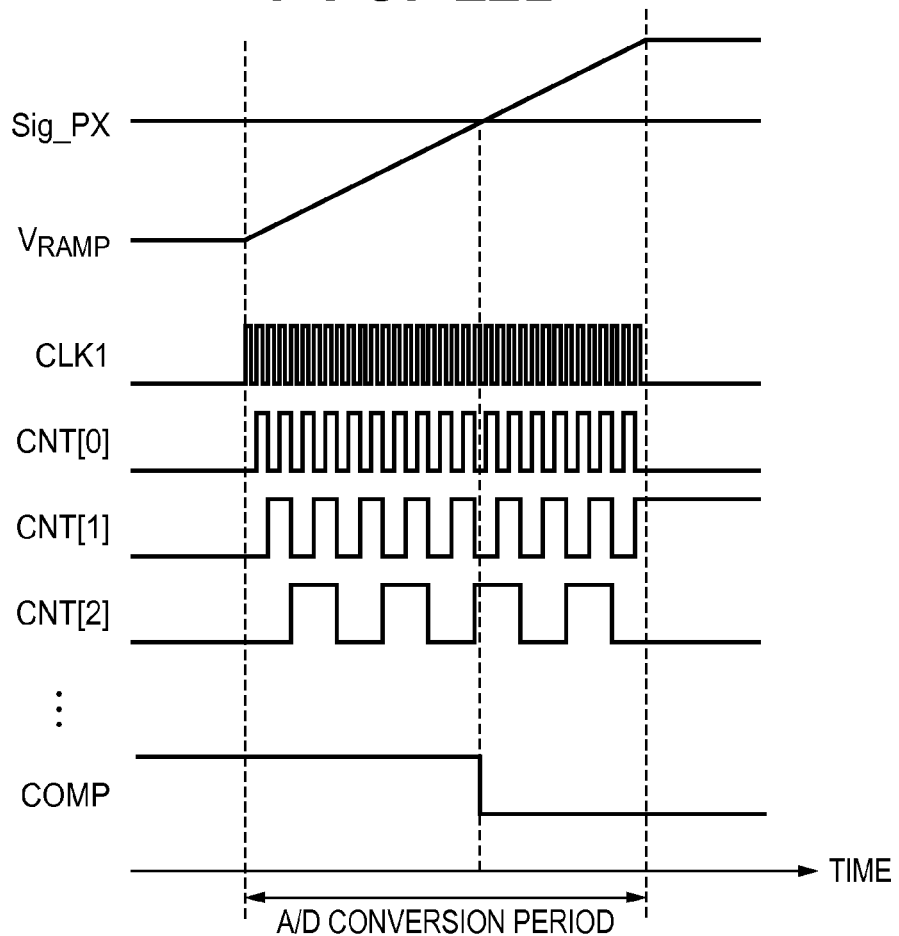

As shown in FIG. 22B, during an A/D conversion period, each clock latch unit 150 receives the count value CNT[n−1:0] from the counter 61. After that, in response to inversion of the output COMP of the comparison unit 11 to change from high level to low level, each of the clock latch units 150 (150-1 to 150-n) samples the value of the corresponding count value CNT[n−1:0]. The output unit 14 outputs the sampled values in order from the upper bit to the lower bit as a signal corresponding to the comparison result of the comparison unit 11, that is, a digital signal based on an analog signal from a pixel.

The readout unit 35 includes the plurality of clock latch units 150 each of which has the same arrangement as that of the clock latch unit 12 or the like of the above-described first embodiment, and in each of which neither charging nor discharging occurs before and after the output COMP of the comparison unit 11 is inverted. Each of the plurality of clock latch units 150 (150-1 to 150-n) receives the count value CNT[n−1:0] from the counter 61. From another viewpoint, the plurality of clock latch units 150 (150-1 to 150-n) respectively receive clock signals having different frequencies. After that, in response to inversion of the output COMP, each of the plurality of clock latch units 150 (150-1 to 150-n) samples the corresponding count value CNT[n−1:0]. The sampling results indicate a signal corresponding to the comparison result of the comparison unit 11, that is, a digital signal to be acquired.

According to this embodiment, the counter is formed using the plurality of clock latch units 150 (150-1 to 150-$n$). Each clock latch unit 150 adopts an arrangement in which neither charging nor discharging occurs by receiving the count value CNT[n−1:0] before and after the output COMP of the comparison unit 11 is inverted. Therefore, this embodiment is also advantageous in reducing the power consumption in A/D conversion.

Although seven embodiments have been described above, the present invention is not limited to them. Each unit can be changed without departing from the spirit and scope of the present invention in accordance with, for example, the purpose of the invention. The units exemplified in the respective embodiments may be combined.

(Imaging System)

In the above embodiments, the solid-state imaging apparatus included in an imaging system represented by a camera or the like has been described. The imaging system conceptually includes not only a device whose principal purpose is shooting but also a device (for example, a personal computer or portable terminal) additionally provided with a shooting function. The imaging system can include the solid-state imaging apparatus according to the present invention exemplified as each of the above-mentioned embodiments, and a processing unit which processes a signal output from the solid-state imaging apparatus. This processing unit can include, for example, an A/D converter, and a processor which processes digital data output from the A/D converter.

The present invention is advantageous in reducing the power consumption in A/D conversion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-027860, filed Feb. 17, 2014, which is hereby incorporated by reference herein in its entirety.

What is claimed is:

1. A solid-state imaging apparatus including a plurality of pixels, and conversion units each configured to A/D-convert a signal from each of said plurality of pixels,
    each of said conversion units comprising
    a comparison unit configured to receive a reference signal, and compare an analog signal from said pixel with the reference signal,
    a sampling unit configured to receive a first clock signal, and sample a signal level of the first clock signal based on an output of said comparison unit,
    a counter configured to receive the first clock signal, and count, based on the output of said comparison unit, a time until a magnitude relationship between the analog signal and the reference signal is reversed, and
    an output unit configured to output a digital signal corresponding to the analog signal based on a count result of said counter and a sampling result of said sampling unit, and
    said sampling unit comprising
    a first latch unit configured to latch the output of said comparison unit in response to the first clock signal,
    a second latch unit configured to latch the output of said comparison unit in response to a second clock signal having a phase different from that of the first clock signal, and
    a third latch unit configured to latch an output of said first latch unit in response to an output of said second latch unit.

2. The apparatus according to claim 1, wherein
    each of said first latch unit, said second latch unit, and said third latch unit includes a first transistor and a second transistor which are exclusively driven by receiving a first input, and a third transistor configured to receive a second input,
    said first transistor, said second transistor, and said third transistor are arranged in series between a power supply node and a ground node,
    said first latch unit receives a signal from said comparison unit as the first input, and receives the first clock signal as the second input,
    said second latch unit receives the signal from said comparison unit as the first input, and receives the second clock signal as the second input, and
    said third latch unit receives a signal from said first latch unit as the first input, and receives a signal as the second input from said second latch unit.

3. The apparatus according to claim 2, wherein one of said first transistor and said second transistor is an NMOS transistor, and the other of said first transistor and said second transistor is a PMOS transistor.

4. The apparatus according to claim 3, wherein
    each of said first latch unit, said second latch unit, and said third latch unit further includes a fourth transistor and a fifth transistor respectively configured to receive signals from said first transistor and said second transistor, and a sixth transistor configured to receive the second input, and
    said fourth transistor, said fifth transistor, and said sixth transistor are arranged in series between the power supply node and the ground node.

5. The apparatus according to claim 1, wherein
    said conversion unit includes N sampling units where N is an integer not less than 2, and
    said N sampling units receive N kinds of clock signals having different phases, and sample the N kinds of clock signals based on the output of said comparison unit.

6. The apparatus according to claim 5, wherein a phase difference between a clock signal received by a first sampling unit of said N sampling units and a clock signal received by a sampling unit other than said first sampling unit is 360°×k/N where k is an integer within a range from 1 (inclusive) to N−1 (inclusive).

7. The apparatus according to claim 6, wherein N is 2.

8. The apparatus according to claim 1, wherein
    said conversion unit includes N sampling units, and
    said N sampling units form a counter configured to output a count value corresponding to the time until the magnitude relationship between the analog signal from said pixel and the reference signal is reversed by receiving N kinds of clock signals having different frequencies, and sampling signal levels of the N kinds of clock signals based on the output of said comparison unit.

9. A solid-state imaging apparatus including a plurality of pixels, and conversion units each configured to A/D convert a signal from each of said plurality of pixels,
    each of said conversion units comprising
    a comparison unit configured to receive a reference signal, and compare an analog signal from said pixel with the reference signal,
    a clock terminal configured to receive a clock signal,
    a counter including an input terminal, and configured to receive the clock signal at said input terminal, and count, based on an output of said comparison unit, a time until a magnitude relationship between the analog signal and the reference signal is reversed, a switch arranged between said clock terminal and said input terminal, a potential fixing unit configured to fix a potential of said input terminal, and an output unit configured to output a digital signal corresponding to the analog signal based on a count result of said counter, wherein before the magnitude relationship is reversed, said switch is rendered conductive to supply the clock signal to said counter, and after the magnitude relationship is reversed, said switch is rendered non-conductive to stop supplying the clock signal to said counter and to cause said potential fixing unit to fix the potential of said input terminal at the potential of said input terminal obtained when the magnitude relationship is reversed.

10. The apparatus according to claim 9, wherein said output unit outputs the digital signal based on the potential of said input terminal fixed by said potential fixing unit.

11. The apparatus according to claim 10, wherein said potential fixing unit includes a first switch configured to fix the potential of said input terminal at a first potential, a second switch configured to fix the potential of said input terminal at a second potential, a first NOR circuit configured to receive the potential of said input terminal and the output of said comparison unit, and switch said first switch to be rendered conductive or non-conductive, and a second NOR circuit configured to receive an output of said first NOR circuit and the output of said comparison unit, and switch said second switch to be rendered conductive or non-conductive.

12. A solid-state imaging apparatus including a plurality of pixels, and conversion units each configured to A/D-convert a signal from each of said plurality of pixels, each of said conversion units comprising a comparison unit configured to receive a reference signal, and compare an analog signal from said pixel with the reference signal, a first counter configured to receive a first clock signal, and count, based on an output of said comparison unit, a time until a magnitude relationship between the analog signal and the reference signal is reversed, a second counter configured to receive a second clock signal having a frequency lower than that of the first clock signal, and count, based on the output of said comparison unit, the time until the magnitude relationship is reversed, a unit configured to control supply of the first clock signal to said first counter and supply of the second clock signal to said second counter, and an output unit configured to output a digital signal corresponding to the analog signal based on count results of said first counter and said second counter, wherein during a period before the magnitude relationship is reversed, said unit stops supplying the first clock signal to said first counter, and supplies the second clock signal to said second counter, during a period after the magnitude relationship is reversed and before a logical level of the second clock signal changes, said unit supplies the second clock signal to said second counter while supplying the first clock signal to said first counter, and during a period after the magnitude relationship is reversed and the logical level of the second clock signal changes, said unit stops supplying the first clock signal to said first counter, and stops supplying the second clock signal to said second counter.

13. The apparatus according to claim 12, wherein the frequency of the second clock signal is $1/2^k$ the frequency of the first clock signal where k is an integer not less than 1.

14. The apparatus according to claim 1, wherein the reference signal is a ramp signal.

15. The apparatus according to claim 9, wherein the reference signal is a ramp signal.

16. The apparatus according to claim 12, wherein the reference signal is a ramp signal.

17. A camera comprising:
a solid-state imaging apparatus defined in claim 1, and
a processing unit configured to process a signal output from said solid-state imaging apparatus.

18. A camera comprising:
a solid-state imaging apparatus defined in claim 9, and
a processing unit configured to process a signal output from said solid-state imaging apparatus.

19. A camera comprising:
a solid-state imaging apparatus defined in claim 12, and
a processing unit configured to process a signal output from said solid-state imaging apparatus.

* * * * *